United States Patent
Glenn et al.

(10) Patent No.: US 6,734,419 B1
(45) Date of Patent: May 11, 2004

(54) METHOD FOR FORMING AN IMAGE SENSOR PACKAGE WITH VISION DIE IN LENS HOUSING

(75) Inventors: Thomas P. Glenn, Gilbert, AZ (US); Steven Webster, Muntinlupa City (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/896,014

(22) Filed: Jun. 28, 2001

(51) Int. Cl.⁷ .................................................. H01J 5/02
(52) U.S. Cl. .................. 250/239; 250/208.1; 174/52.1; 257/666; 257/684
(58) Field of Search ............................. 250/239, 214.1, 250/208.1; 174/52.1–52.4; 257/433, 434, 680, 684, 666–678, 432; 348/340

(56) References Cited

U.S. PATENT DOCUMENTS

| 5,113,290 A | * | 5/1992 | Fletcher ...................... 250/239 |
| 5,400,072 A | * | 3/1995 | Izumi et al. ................. 348/335 |
| 5,821,532 A | | 10/1998 | Beaman et al. .............. 250/239 |
| 5,861,654 A | * | 1/1999 | Johnson ..................... 250/208.1 |
| 5,865,935 A | | 2/1999 | Ozimek et al. ........... 156/303.1 |
| 5,912,774 A | * | 6/1999 | Yoshida et al. .............. 359/823 |
| 5,990,552 A | * | 11/1999 | Xie et al. .................... 257/712 |
| 5,998,878 A | | 12/1999 | Johnson ..................... 257/797 |
| 6,037,641 A | * | 3/2000 | Goel .......................... 257/432 |
| 6,075,237 A | | 6/2000 | Ciccarelli ................. 250/208.1 |
| 6,133,569 A | * | 10/2000 | Shoda et al. ................. 250/330 |
| 6,144,031 A | * | 11/2000 | Herring et al. ........... 250/252.1 |
| 6,147,389 A | | 11/2000 | Stern et al. .................. 257/434 |
| 6,303,978 B1 | * | 10/2001 | Daniels et al. .............. 257/642 |
| 6,389,687 B1 | | 5/2002 | Glenn et al. .................... 29/832 |
| 6,518,656 B1 | * | 2/2003 | Nakayama et al. ......... 257/680 |
| 6,571,466 B1 | * | 6/2003 | Glenn et al. ................... 29/841 |
| 2001/0035576 A1 | | 11/2001 | Wachtler et al. ............ 257/697 |
| 2001/0050721 A1 | * | 12/2001 | Miyake ...................... 348/374 |
| 2002/0110949 A1 | | 8/2002 | Tonti et al. .................... 438/60 |

FOREIGN PATENT DOCUMENTS

JP          08-084278        *   3/1996

* cited by examiner

*Primary Examiner*—Thanh Luu
*Assistant Examiner*—Stephen Yam
(74) *Attorney, Agent, or Firm*—Gunnison, McKay & Hodgson, L.L.P.; Philip J. McKay

(57) ABSTRACT

A method for forming an image sensor assembly includes forming a lead frame or Land Grid Array (LGA) integrally into a molded image sensor die package so that the lead frame or LGA is fully supported and structurally fortified by the molded image sensor die package. An image sensor die is then attached to the thus supported lead frame or LGA using a standard flip-chip connection.

14 Claims, 11 Drawing Sheets

METHOD FOR FORMING AN IMAGE SENSOR PACKAGE WITH VISION DIE IN LENS HOUSING

FIELD OF THE INVENTION

The present invention relates generally to the packaging of electronic components. More particularly, the present invention relates to method for forming an image sensor assembly.

BACKGROUND OF THE INVENTION

Methods for forming image sensors and assemblies are well known to those of skill in the art. Prior art image sensors typically included an active area, which was responsive to electromagnetic radiation. In prior art image sensor assemblies, an image sensor was located within a housing that supported a window. Radiation passed through the window and struck the active area of the image sensor, which responded to the radiation. For the image sensor to function properly, the image sensor had to be positionally aligned with the window to within tight tolerances.

In the prior art, an image sensor assembly was formed by mounting the image sensor to a printed circuit motherboard. After the image sensor was mounted, a housing was mounted around the image sensor and to the printed circuit motherboard. This housing provided a seal around the image sensor, while at the same time, supported a window above the image sensor.

Beaman et al., U.S. Pat. No. 5,821,532, hereinafter Beaman, which is herein incorporated by reference in its entirety, is one example of a prior art image sensor assembly. Beaman sets forth a printed circuit board that included a pair of apertures used as alignment features for mounting the image sensor and for mounting the optics that included the window. More particularly, the pair of apertures were used as the mounting reference for the image sensor and then were used as the mounting reference for the optics.

As discussed in Beaman, prior art image sensor assemblies used a housing to support the window and to hermetically seal the image sensor (see housing 24 and window 25 of Beaman FIG. 4 for example). This housing was typically formed of ceramic that advantageously had excellent resistance to moisture transmission to protect the image sensor from the ambient environment. However, ceramic is relatively expensive compared to other packaging materials and, in the current market, it is critical to form the image sensor assembly at minimal cost.

In addition to using relatively expensive ceramics, the prior art ceramic image sensor assemblies were also very labor intensive and expensive to produce. For instance, after the prior-art ceramic image sensor assembly was constructed, the lens assembly was placed over the image sensor assembly. Typically, the lens assembly was attached directly to the substrate after the image sensor assembly was attached to the substrate. After attachment, the lens assembly was adjusted, for example with adjustment screws, to move the lens assembly until the proper focus was attained. This rough adjustment was very labor intensive. Further, a large tolerance was associated with this very rough adjustment.

In addition, mounting the housing at the printed circuit board level, as was done in the prior art, was itself inherently labor intensive and made repair or replacement of the image sensor difficult. In particular, removal of the housing exposed the image sensor to the ambient environment. Since the image sensor was sensitive to dust as well as other environmental factors, mounting the housing at the printed circuit board level made it mandatory to make repairs, or to replace, the image sensor in a controlled environment such as a clean room, otherwise there was a risk of damaging or destroying the image sensor. Thus, using the prior art method of mounting the housing at the printed circuit board level often meant transporting the entire motherboard into the clean room.

To overcome the problems with prior art ceramic image sensor assemblies discussed above, image sensor packages have recently been introduced that include a molding with an interior locking feature and an exterior locking feature. One example of a prior art molded image sensor assembly is set forth in the commonly assigned U.S. patent application Ser. No. 09/457,505 entitled "MOLDED IMAGE SENSOR PACKAGE", listing Steven Webster as inventor, filed on Dec. 8, 1999, hereinafter referred to as the Webster reference, which is incorporated herein for all purposes, and in its entirety, by reference.

The interior locking feature and the exterior locking feature of prior art molded image sensor assemblies allowed the package to be made of a molding, typically plastic, that was a low cost part. The Webster image sensor package further included a window having an interior surface and an exterior surface. The exterior locking feature of the molding contacted a periphery of the exterior surface of the window and the interior locking feature of the molding -contacted a periphery of the interior surface of the window. In this manner, the window was supported by the molding both top and bottom. In addition, the distance which moisture had to travel along the interface between the molding and window to reach the image sensor was maximized, thus essentially eliminating moisture ingress into the image sensor package.

As a result, the prior art molded image sensor assemblies, such as the Webster image sensor package, did not suffer from the high costs associated with ceramic assemblies nor were they labor intensive or require large tolerances. In addition, the prior art molded image sensor assemblies, such as the Webster image sensor package, did not involve mounting the housing at the printed circuit board level. Consequently, these prior art molded image sensor assemblies were a marked improvement over the prior art ceramic image sensor assemblies.

While prior art molded image sensor assemblies represented a significant improvement over the ceramic prior art assemblies, the prior art molded image sensor assemblies were typically relatively large. This was because, in prior art molded image sensor assemblies, the image sensor chip was typically electrically connected to the motherboard using a support substrate and bond wires connecting bond pads on the image sensor chip to bonding locations on the substrate. The substrate was then, in turn, electrically connected to the motherboard. Consequently, extra structure, i.e., an extra substrate, and bond wires, both of which added significantly to the cost and the size of prior art molded image sensor assemblies, were required. In addition, the bond wires themselves were susceptible to breaking and the image sensor assembly therefore suffered from decreased reliability.

As the electronics industry has moved to smaller and lighter weight electronic devices, it has become increasingly important that the size of the image sensor assembly used within these electronic devices be minimized. However, as discussed above, the prior art molded image sensor assemblies used bond wire connections, which were inherently bulky and expensive. As a result, the prior art molded image sensor assemblies were relatively large and expensive to produce.

In the prior art it was well known that, theoretically, a more ideal method of connecting an image sensor assembly to a motherboard would be to connect the image sensor chip to a lead frame or a Land Grid Array (LGA) directly in a flip-chip configuration. Then the lead frame and sensor could be packaged in an assembly and electrically connected to the motherboard. If this structure were possible, then the extra substrate and bond wires of the prior art molded image sensor assemblies could be eliminated while, at the same time, the image sensor assembly cost, image sensor assembly reliability and image sensor assembly size could be improved.

FIG. 1 shows a top plan view of a lead frame 10 including: frame 11; internal connection leads 12; and external connection leads 13. While the flip-chip structure discussed above sounded advantageous in theory, in practice, it was found that connecting an image sensor die to internal connection leads 12 of lead frame 10 in a flip-chip configuration was prohibitively difficult, and often impossible. This was because internal connection leads 12, external connection leads 13 and frame 11 of lead frame 10 were too delicate and would bend, deform and/or break as the image sensor die was being attached. In addition, external connection leads 13 would also bend, deform and/or break as the image sensor assembly was being attached to an external unit such as a circuit board or motherboard.

As a result, proper connections were not made, internal and external connection leads 12 and 13 broke and the resulting structures were often warped and suffered from unacceptably poor reliability. Consequently, in the prior art, molded image sensor assemblies almost exclusively used the bond wire connections and included the standard bond wire connection substrates discussed above. As a result, prior art molded image sensor assemblies were more expensive, less reliable, larger and more delicate than ideal.

What is needed is an image sensor assembly, which is simpler and less expensive to manufacture, easier to service, smaller and more reliable than either prior art ceramic image sensor assemblies or prior art molded image sensor assemblies.

SUMMARY OF THE INVENTION

According to the present invention, a method for forming an image sensor assembly includes integrally forming a lead frame or Land Grid Array (LGA) into a molded image sensor die package so that the lead frame or LGA is fully supported and structurally fortified by the molded image sensor die package. An image sensor die is then attached to the thus supported lead frame or LGA using a standard flip-chip connection.

The image sensor assemblies formed by the method of the invention include a molded image sensor package. Consequently, like the Webster image sensor packages of the prior art discussed above, the image sensor assemblies of the invention do not suffer from the high costs associated with ceramic assemblies nor are they labor intensive or require large tolerances. In addition, the image sensor assemblies formed by the methods of the invention, like the Webster image sensor package of the prior art, do not involve mounting the housing at the printed circuit board level. Consequently, the image sensor assemblies of the invention are a significant improvement over the prior art ceramic image sensor assemblies.

In addition, and in contrast to prior art molded image sensor assemblies such as the Webster package, according to methods of the invention, the lead frame or LGA is integrally formed into a molded image sensor die package so that the lead frame or LGA is fully supported and structurally fortified by the molded image sensor die package. Consequently, the problems of bending, deformation and/or breaking of the lead frame or LGA during image sensor die attachment are avoided. As a result, proper connections are made, leads do not break, the connections are not stressed and the resulting structures are not warped nor do they suffer from poor reliability.

Thus, using the method of the invention, molded image sensor assemblies can utilize flip-chip connections and avoid the costly, and bulky, bond wire connections of the prior art that included the standard bond wire connection substrates discussed above. As a result, molded image sensor assemblies of the invention are less expensive, more reliable, smaller and sturdier than prior art molded image sensor assemblies.

In particular, one embodiment of the invention for packaging an image sensor includes forming an image sensor die package that includes: an optical element support, the optical element support defining an aperture with an optical centerline; and an external connection assembly, the external connection assembly being an integral part of the image sensor die package.

The method also includes positioning in the image sensor package optical element support an optical element which includes an optical element first surface and an optical element second surface, opposite the optical element first surface, the optical element being positioned in the image sensor package optical element support such that the optical element first surface and the optical element second surface are approximately perpendicular to the optical centerline.

An image sensor die is then provided that includes an image sensor die first surface and an image sensor die second surface, opposite the image sensor die first surface, the image sensor die first surface having an active region.

The image sensor die first surface is then electrically coupled to a first portion of the external connection assembly in a flip-chip configuration such that the active region of the first surface of the image sensor die is at least partially aligned with the optical element support aperture and the optical centerline so that at least a potion of the active region faces the second surface of the optical element.

In one embodiment of the method of the invention, the image sensor die package is formed such that the external connection assembly is a lead frame including internal connection leads and external connection leads and the image sensor die is electrically coupled to the internal connection leads in a flip-chip configuration.

In one embodiment of the method of the invention, the image sensor die package is formed of molded plastic, the image sensor die package being molded around a portion of the lead frame such that the portion of the lead frame is molded into the image sensor die package.

In one embodiment of the method of the invention, the molded image sensor die package is formed to include a base and an optical element support housing including the optical element support.

In one embodiment of the method of the invention, the image sensor die package is formed such that the external connection assembly is a land grid array that includes internal connection points and external connection points and the image sensor die is electrically coupled to the internal connection points in a flip-chip configuration. In one embodiment of the method of the invention, the image sensor die package is formed of molded plastic package, the image sensor die package being molded over the land grid array such that the land grid array is formed on a first surface of the image sensor die package.

In one embodiment of the method of the invention, the image sensor die package is formed to include a base and an optical element support housing including the optical element support and the land grid array is formed on a first surface of the image sensor die package base.

In one embodiment of the invention, a method for packaging an image sensor includes providing an adjustable focus image sensor die package that includes: an optical element support, the optical element support defining an optical element support aperture with an optical centerline; an optical element support housing, the optical element support housing defining an optical element support housing aperture with the same the optical centerline; and an external connection assembly, the external connection assembly being an integral part of the adjustable focus image sensor die package An optical element is included with an optical element first surface and an optical element second surface, opposite the optical element first surface, the optical element being positioned in the optical element support such that the optical element first surface and the optical element second surface are approximately perpendicular to the optical centerline.

An image sensor die is provided that includes an image sensor die first surface and an image sensor die second surface, opposite the image sensor die first surface, the image sensor die first surface having an active region.

The image sensor die first surface is then electrically coupled to a first portion of the external connection assembly in a flip-chip configuration such that the active region of the first surface of the image sensor die is at least partially aligned with the optical element support aperture and the optical centerline so that at least a portion of the active region faces the second surface of the optical element.

In one embodiment of the method of the invention, the adjustable focus image sensor die package is formed such that the external connection assembly is a lead frame which includes internal connection leads and external connection leads and the image sensor die is electrically coupled to the internal connection leads in a flip-chip configuration. In one embodiment of the method of the invention, the image sensor die package is formed of molded plastic, the image sensor die package being molded around a portion of the lead frame such that the portion of the lead frame is molded into the image sensor die package.

In one embodiment of the method of the invention, the adjustable focus image sensor die package is formed to further include a base, the optical element support housing being positioned on the base and the optical element support aperture is formed to have a diameter that is smaller than a diameter of the optical element support housing aperture and the optical element support is positioned within the optical element support housing. In one embodiment of the method of the invention, the optical element support is movable with respect to the optical element support housing along the optical centerline, thereby allowing a focal point of the optical element to be adjusted.

In one embodiment of the method of the invention, the optical element support and the optical element support housing are formed with threads such that the optical element support and the optical element support housing are threadably attached, thereby allowing the focal point of the optical element to be adjusted by rotating the optical element support around the optical centerline related to the optical element support housing.

In one embodiment of the method of the invention, the adjustable focus image sensor die package is formed such that the external connection assembly is a land grid array which includes internal connection points and external connection points and the image sensor die is electrically coupled to the internal connection points in a flip-chip configuration.

In one embodiment of the method of the invention, the adjustable focus image sensor die package is formed of molded plastic, the image sensor die package being molded over the land grid array such that the land grid array is formed on a first surface of the image sensor die package.

In one embodiment of the method of the invention, the molded adjustable focus image sensor die package is formed to further include a base and the land grid array is formed on a first surface of the image sensor die package base and the optical element support housing is positioned on a second surface of the base, opposite the first surface of the base.

In one embodiment of the method of the invention, the optical element support is movable with respect to the optical element support housing along the optical centerline, thereby allowing a focal point of the optical element to be adjusted. In one embodiment of the method of the invention, the optical element support and the optical element support housing are formed with threads such that the optical element support and the optical element support housing are threadably attached, thereby allowing the focal point of the optical element to be adjusted by rotating the optical element support around the optical centerline relative to the optical element support housing.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

According to the present invention, an image sensor assembly (100 in FIG. 2B, 300 in FIG. 3, 400 in FIG. 4A, 500 in FIG. 5, 600 in FIG. 6 and 700 in FIG. 7) includes a lead frame or Land Grid Array (LGA) (109 in FIG. 2B, 309 in FIG. 3, 409 in FIG. 4A, 509 in FIG. 5, 609 in FIG. 6 and 709 in FIG. 7) integrally formed into a molded image sensor die package (101 in FIG. 2B, 301 in FIG. 3, 401 in FIG. 4A, 501 in FIG. 5, 601 in FIG. 6 and 701 in FIG. 7) so that the lead frame or LGA is fully supported and structurally fortified by the molded image sensor die package. An image sensor die (111 in FIG. 2B, 311 in FIG. 3, 411 in FIG. 4A, 511 in FIG. 5, 611 in FIG. 6 and 711 in FIG. 7) is then attached to the thus supported lead frame or LGA using a standard flip-chip connection (121 in FIG. 2E and 421 in FIG. 4D).

The image sensor assemblies of invention include a molded image sensor package. Consequently, the image sensor assemblies of the invention do not suffer from the high costs associated with ceramic assemblies nor are they labor intensive or require large tolerances. In addition, the image sensor assemblies of the invention do not involve mounting the housing at the printed circuit board level. Consequently, the image sensor assemblies of the invention are a significant improvement over the prior art ceramic image sensor assemblies.

In addition, according to the invention, the lead frame or LGA is integrally formed into a molded image sensor die package so that the lead frame or LGA is fully supported and structurally fortified by the molded image sensor die package. Consequently, the prior art problems of bending, deformation and/or breaking of the lead frame or LGA during image sensor die attachment are avoided. As a result, proper connections are made, leads do not break, the connections are not stressed and the resulting structures are not warped nor do they suffer from poor reliability.

Thus, using the invention, molded image sensor assemblies can utilize flip-chip connections and avoid the costly and bulky bond wire connections of the prior art that included the standard bond wire connection substrates discussed above. As a result, molded image sensor assemblies of the invention are less expensive, more reliable, smaller and sturdier than prior art molded image sensor assemblies.

Figure 1:
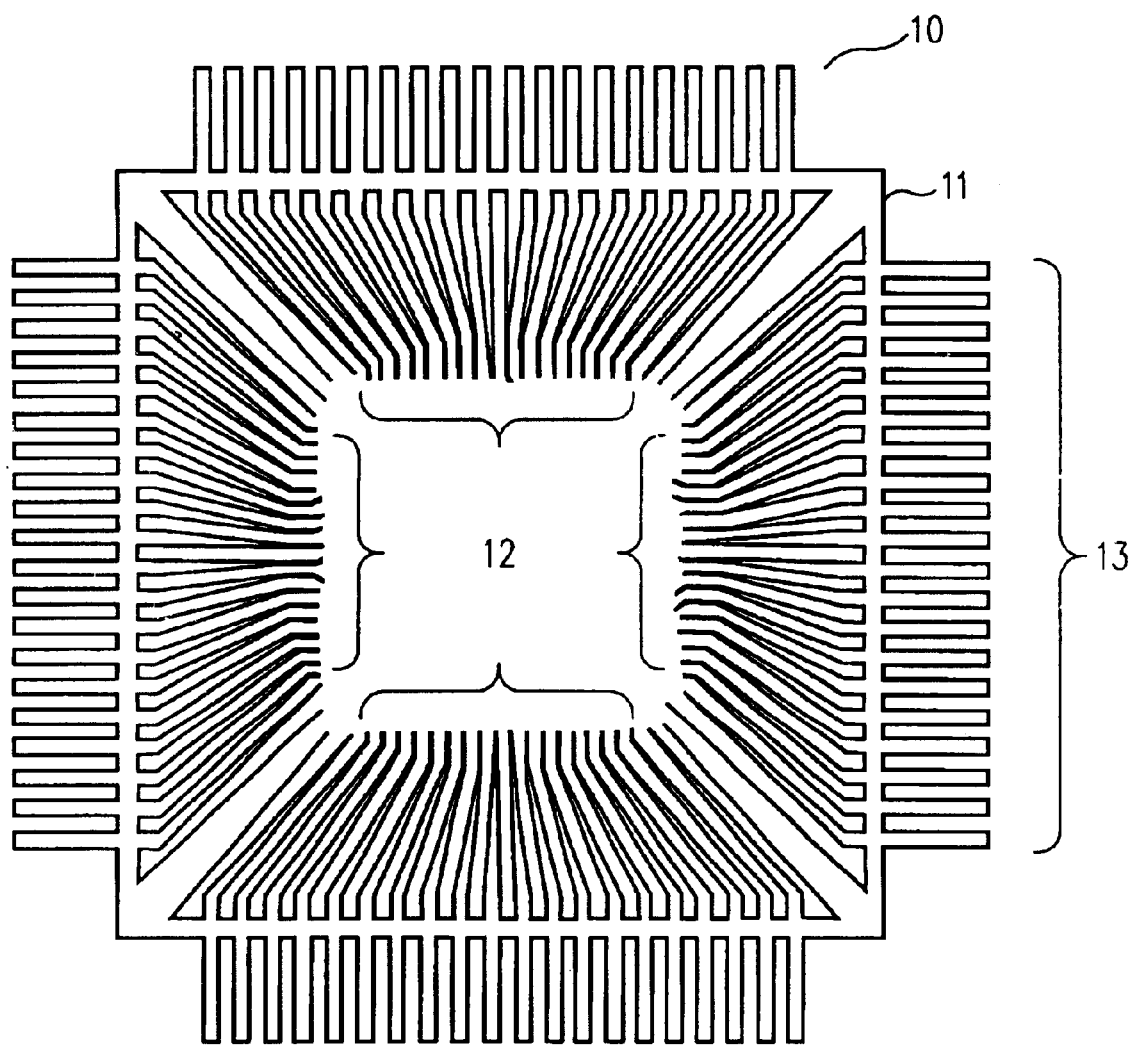
FIG. 1 shows a top plan view of a prior art lead frame.
Figure 2A:
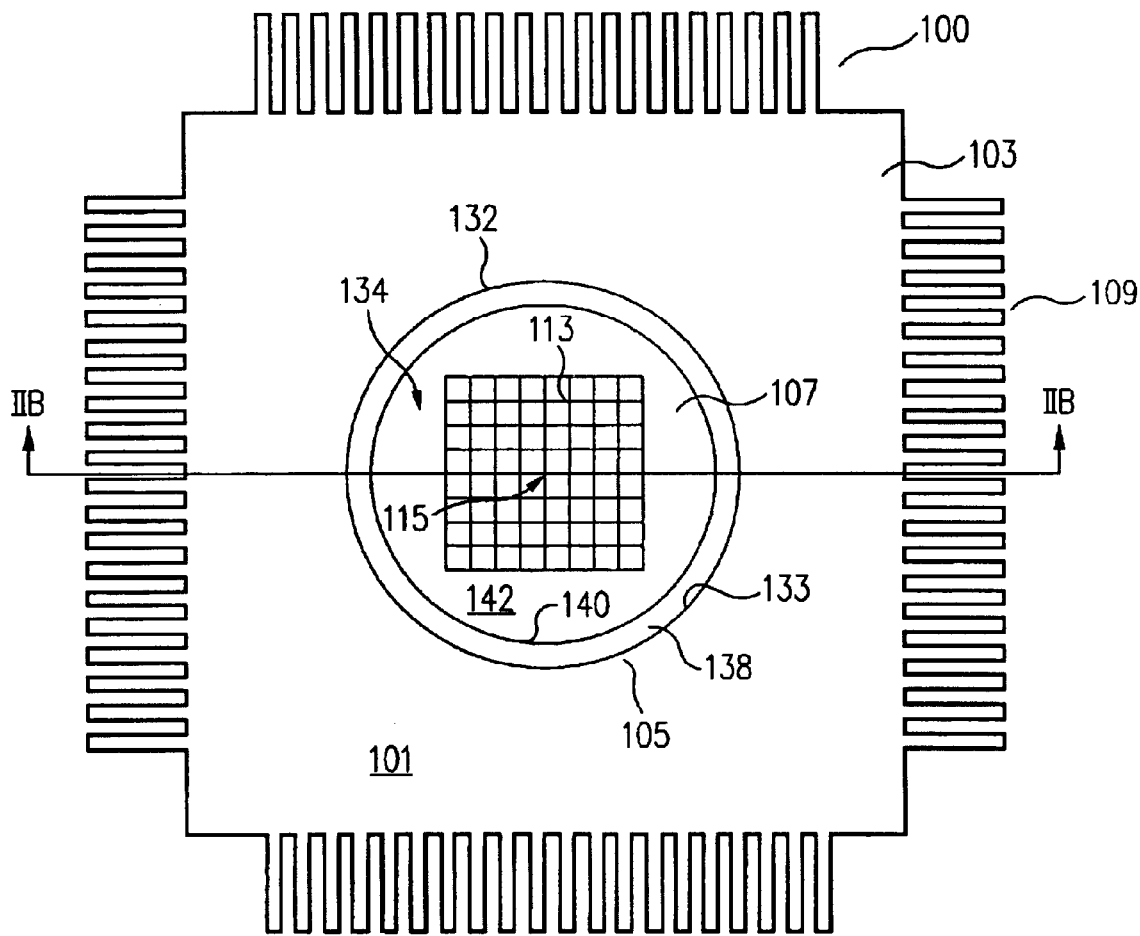
FIG. 2A is a top plan view of an image sensor assembly in accordance with one embodiment of the present invention.
Figure 2B:
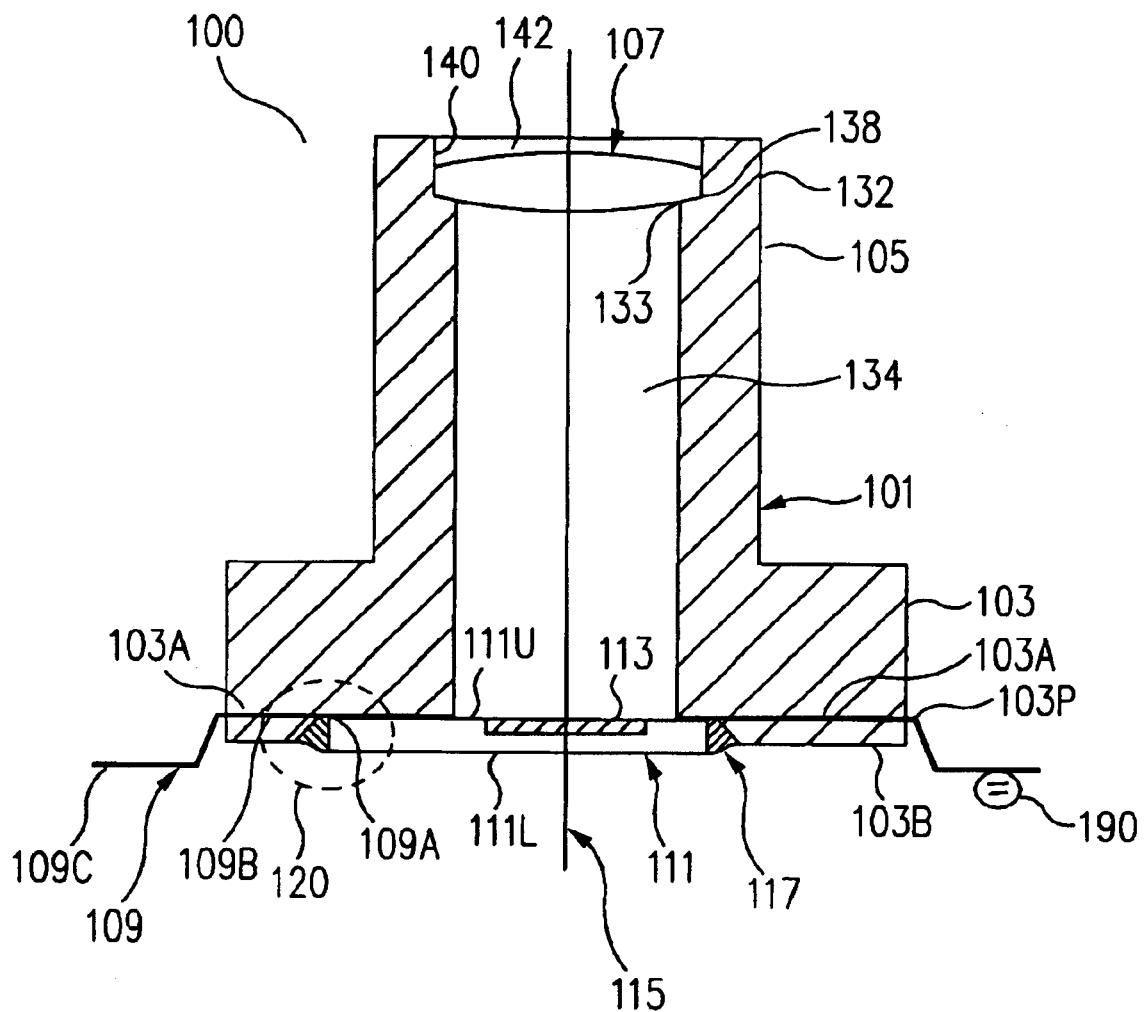
FIG. 2B is a cross-sectional view of the image sensor assembly of FIG. 2A as seen along the line IIB—IIB of FIG. 2A.

FIG. 2A is a top plan view of an image sensor assembly 100 in accordance with one embodiment of the present invention. FIG. 2B is a cross-sectional view of image sensor assembly 100 taken along the line IIB—IIB of FIG. 2A. Image sensor assembly 100 is used in a wide variety of applications, e.g., cameras and cellular telephones.

Referring to FIGS. 2A and 2B together, image sensor assembly 100 includes: an image sensor die package 101 with a base 103 and a lens housing 105; an optical element 107; a lead frame 109; and an image sensor die 111 having an active region 113 on an upper surface 113U. Also shown in FIGS. 2A and 2B is the optical centerline 115 and sealer 117 covering a portion 109A of internal connection lead 109B of lead frame 109.

Generally, active area 113 of image sensor die 111 is responsive to radiation, e.g., electromagnetic radiation, as is well known to those of skill in the art. For example, active area 113 is responsive to infrared radiation, ultraviolet light, and/or visible light. Illustratively, image sensor die 111 is a CMOS image sensor device, a charge coupled device (CCD), a pyroelectric ceramic on CMOS device, or an erasable programmable read-only memory device (EPROM), although other image sensors are used in other embodiments.

In an alternative embodiment, active area 113 of image sensor die 111 transmits radiation such as electromagnetic radiation. For example, image sensor die 111 is a light emitting diode (LED) micro-display. In accordance with this embodiment, radiation transmitted by active area 113 emanates from image sensor assembly 100. For simplicity, in the above and following discussions, active area 113 is discussed as a receiver of radiation. However, in light of this disclosure, those of skill in the art will recognize that active area 113 can be a receiver of radiation, a transmitter of radiation, or a transceiver, i.e., a transmitter and a receiver, of radiation.

In one embodiment of the invention, image sensor die package 101 is molded plastic such as glass filled NORYL, e.g., glass filled nylon 6/6. In another embodiment of the invention, image sensor die package 101 is molded from a liquid crystal polymer such as Riton™ produced by Dow Chemical. In other embodiments of the invention, other materials are used. For example, in one embodiment, image sensor die package 101 is a high temperature plastic such that image sensor die package 101 maintains integrity during re-flow, e.g., during melting of solder bumps (not shown) on image sensor die 111.

Image sensor die package 101 includes integrally formed base 103 and lens housing 105. Lens housing 105 includes an exterior cylindrical surface 132 and an interior cylindrical surface 133, which defines a central aperture 134 having optical center line 115 perpendicular to upper surface 111U of image sensor die 111. Central aperture 134 extends upwards and is aligned above active area 113 such that active area 113 is visible through central aperture 134, as best shown in FIG. 2A.

It is worth noting that in some embodiments of the invention, optical centerline 115 does not align with a physical centerline (not shown) of image sensor die 111. That is to say, image sensor die 111 does not need to be centered on central aperture 134 and image sensor die 111 can be offset from the centerline (not shown) of image sensor assembly 100. The choice of whether to center image sensor die 111 along centerline 115 and central aperture 134 is made on an application-by-application basis and is based on the needs of the manufacturer. All that is necessary is that a desired portion of active region 113 be within central aperture 134.

Optical element 107, such as a lens (hereinafter lens 107) is mounted in a support 138, hereinafter referred to as lens support 138. In this embodiment, lens support 138 is a cylindrical annulus having an interior cylindrical surface 140, which defines an aperture 142. Lens 107 is positioned in aperture 142 such that lens 107 and lens support 138 also have a longitudinal axis coextensive with optical centerline 115. In one embodiment, interior cylindrical surface 140 may not be exactly cylindrical, e.g., is hourglass shaped, but has other shapes in other embodiments.

As seen in FIGS. 2A and 2B, image sensor assembly 100 also includes lead frame 109. Lead frame 109 includes internal connection leads 109B and external connection leads 109C. According to the present invention, lead frame 109 is integrally formed into image sensor die package 101 so that internal connection leads 109B of lead frame 109 are fully supported and structurally fortified by portion 103A (FIG. 2B) of base 103 of image sensor die package 101.

In one embodiment of the invention, lead frame 109 is integrally formed into image sensor die package 101 by placing lead frame 109 in a mold (not shown) for forming image sensor die package 101 and then molding image sensor die package 101 around lead frame 109 so that all but portion 109A of internal connection leads 109B are surrounded, and supported, by image,sensor die package 101. In one embodiment of the invention, image sensor die package 101 is molded, including lead frame. 109, using injection molding by methods well known to those of skill in the art.

In another embodiment of the invention, lead frame 109 is attached to image sensor die package 101 with adhesive so that all but portion 109A of internal connection leads 109B are supported by image sensor die package 101. In yet another embodiment of the invention (not shown), image sensor die package 101 is a two-piece package and lead frame 109 is sandwiched between the two pieces so that all but portion 109A of internal connection leads 109B is supported by image sensor die package 101. In another embodiment of the invention, lead frame 109 is ultrasonically welded to image sensor die package 101. In another embodiment of the invention, lead frame 109 is heat staked to sensor die package 101. In yet another embodiment of the invention lead frame 109 is snapped into position and friction mounted to sensor die package 101.

Also shown in FIG. 2B is an exemplary solder ball 190 that, in one embodiment of the invention, is formed on each of external connection leads 109C for making external connections. Solder balls, such as solder ball 190, and their use for making external connections to a larger unit such as a motherboard (not shown), are well know to those of skill in the art. Consequently, the methods of forming solder balls and their use for making external connections is not discussed in more detail herein to avoid detracting from the invention.

Figure 2C:
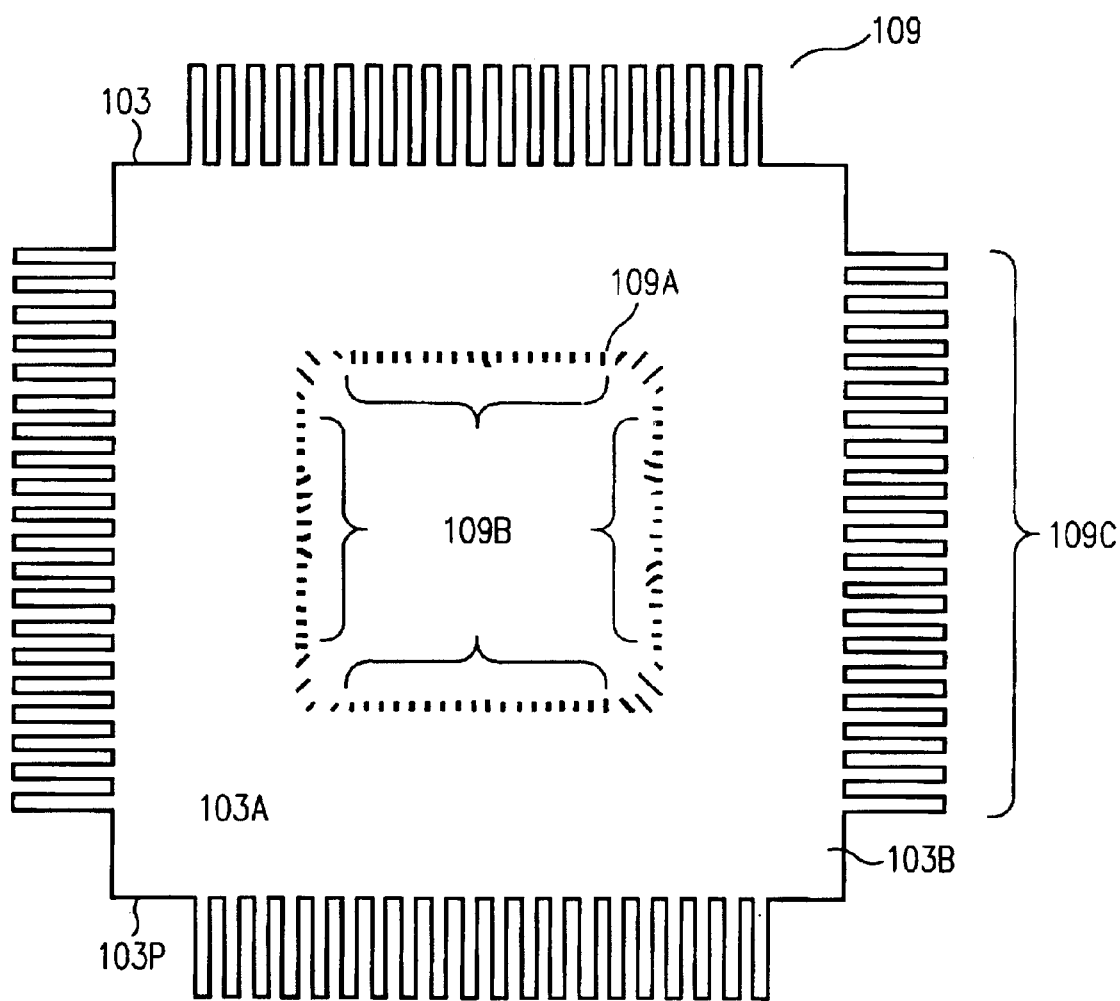
FIG. 2C is a bottom plan view of the image sensor assembly of FIG. 2A and FIG. 2B, prior to the attachment of the image sensor die in accordance with one embodiment of the invention.

FIG. 2C is a bottom plan view of image sensor assembly 100 of. FIG. 2A and FIG. 2B prior to the attachment of image sensor die 111. Shown in FIG. 2C is a bottom surface 103B of base 103 of image sensor die package 101 along with portion 109A of internal connection leads 109B of lead frame 109. As seen in FIG. 2C, according to the invention, external connection leads 109C of lead frame 109 extend beyond the perimeter 103P of base 103 of image sensor die package 101. Consequently, image sensor assembly 100 can be electrically connected to a larger component such as a circuit board or motherboard with relative ease using methods well known to those of skill in the art.

As seen in FIG. 2C, lead frame 109 is integrally formed into image sensor die package 101.so that lead frame 109, including internal connection leads 109B, is fully supported and structurally fortified by portion 103A of base 103 of image sensor die package 101. Consequently, the problems of bending, deformation and/or breaking of lead frame 109, internal connection leads. 109B and/or external connection leads 109C, during image sensor die 111 attachment, and during the attachment of image sensor assembly 100 to an external unit such as a motherboard, are avoided.

Figure 2D:
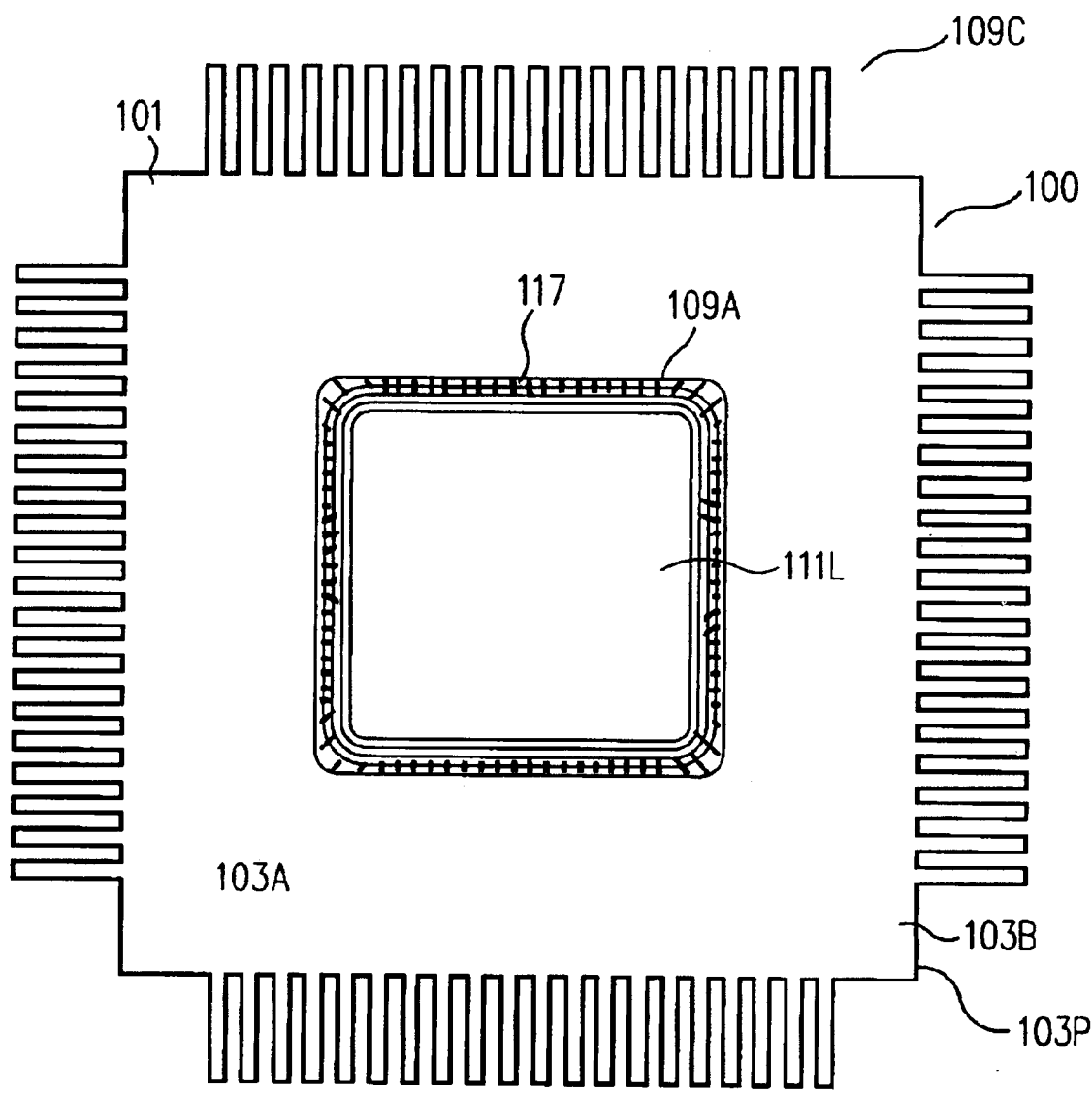
FIG. 2D is a bottom plan view of the image sensor assembly of FIG. 2A and FIG. 2B in accordance with one embodiment of the present invention.

FIG. 2D is a bottom plan view of image sensor assembly 100 of FIG. 2A and FIG. 2B, in accordance with one embodiment of the present invention, after image sensor die 111 has been attached. Shown in FIG. 2D is bottom surface 103B of base 103 of image sensor die package 101 along with lower surface 111L of image sensor die 111 and sealer 117 covering portion 109A of internal connection leads 109B of lead frame 109. As seen in FIG. 2D, according to the invention, external connection leads 109C of lead frame 109 extend beyond the perimeter 103P of base 103 of image sensor die package 101. Consequently, image sensor assembly 100 can be electrically connected to a larger component such as a circuit board or motherboard with relative ease.

As discussed above and shown in FIGS. 2A, 2B, 2C and 2D, according to the invention, lead frame 109 is integrally formed into image sensor die package 101 so that lead frame 109, including internal connection leads 109B, is fully supported and structurally fortified by portion 103A of base 103 of image sensor die package 101. Consequently, the problems of bending, deformation and/or breaking of lead frame 109, internal connection leads 109B and/or external connection leads 109C, during image sensor die 111 attachment, and during the attachment of image sensor assembly 100 to an external unit such as a motherboard, are avoided. As a result, using the invention, image sensor die 111 can be connected to lead frame 109 using a standard flip-chip connection. This aspect of the invention is shown in more detail in FIG. 2E.

Figure 2E:
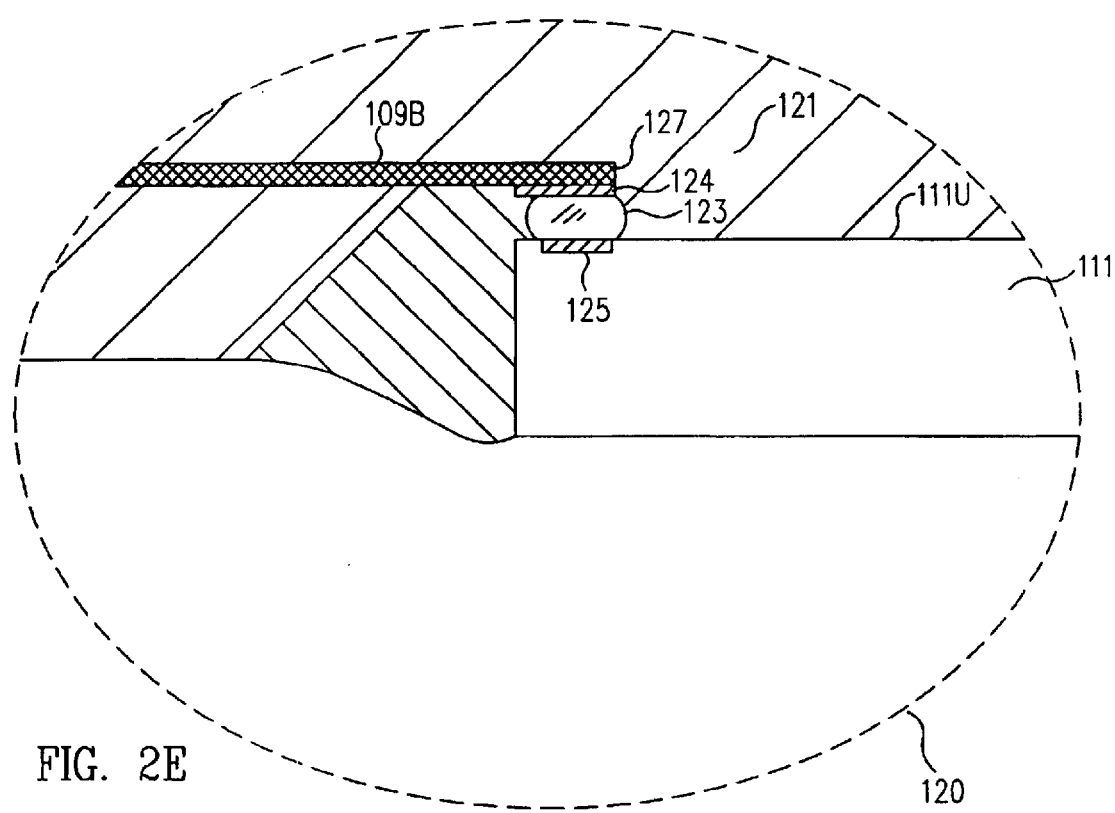
FIG. 2E is an enlargement of a portion of the flip-chip connection shown in FIG. 2B in accordance with one embodiment the invention.

FIG. 2E is an enlargement of the portion 120 shown in FIG. 2B. As seen in FIG. 2E, flip-chip connection 121 includes a solder bump 123 on upper surface 111U of image sensor die 111. Solder bump 123 can be made from several well known metals or compounds by methods well known to those of skill in the art. For instance, solder bump 123 can be: solder; lead; gold; silver; electrically conductive epoxy paste or film; or any other electrically conductive material. Solder bump 123 is re-flowed to form an electrical connection between contact 125 on image sensor die 111 and portion 127 of internal connection lead 109B of lead frame 109. As shown in FIG. 2E, in one embodiment of the invention, portion 127 of internal connection lead 109B of lead frame 109 includes a contact 124. Contact 124 can be either a plated contact or an applied contact and is typically formed of a wetting metal. Contact 124 can also include multiple layers of metals or other materials as is well known in the art. Once the connection is made between contact 125 and portion 127 of internal connection lead 109B, external connection lead 109C (FIG. 2B) is electrically connected to contact 125 (FIG. 2E) and contact 125 can be readily connected to a larger structure (not shown), such as a circuit board or motherboard, by external contact lead 109C.

This process is identically performed for each of a plurality of contacts 125 on image sensor die 111 and a plurality of internal connection leads 109B of lead frame 109. Flip-chip connections, and methods for forming flip-chip connections, are well known to those of skill in the art. Consequently, the methods for making flip-chip connections are not discussed in more detail herein to avoid detracting from the invention.

In one embodiment of the invention, sealer 117 that covers portion 109A of internal connection lead 109B of lead frame 109 (FIGS. 2B, 2C and 2D) is an epoxy sealer, well known to those of skill in the art.

As discussed above, by molding lead frame 109, including internal connection leads 109B, into image sensor die package 101, lead frame 109, including internal connection leads 109B, is fully supported and structurally fortified by portion 103A of base 103 of image sensor die package 101. As a result, image sensor assemblies 100 of the invention can utilize flip-chip connections and avoid the costly and bulky bond wire connections of the prior art. In addition, image sensor assembly can be mounted to a larger unit such as a motherboard, with less fear of bending external connection leads 109C. Consequently, image sensor assemblies 100 of the invention are less expensive, more reliable, smaller and sturdier than prior art molded image sensor assemblies.

Figure 3:
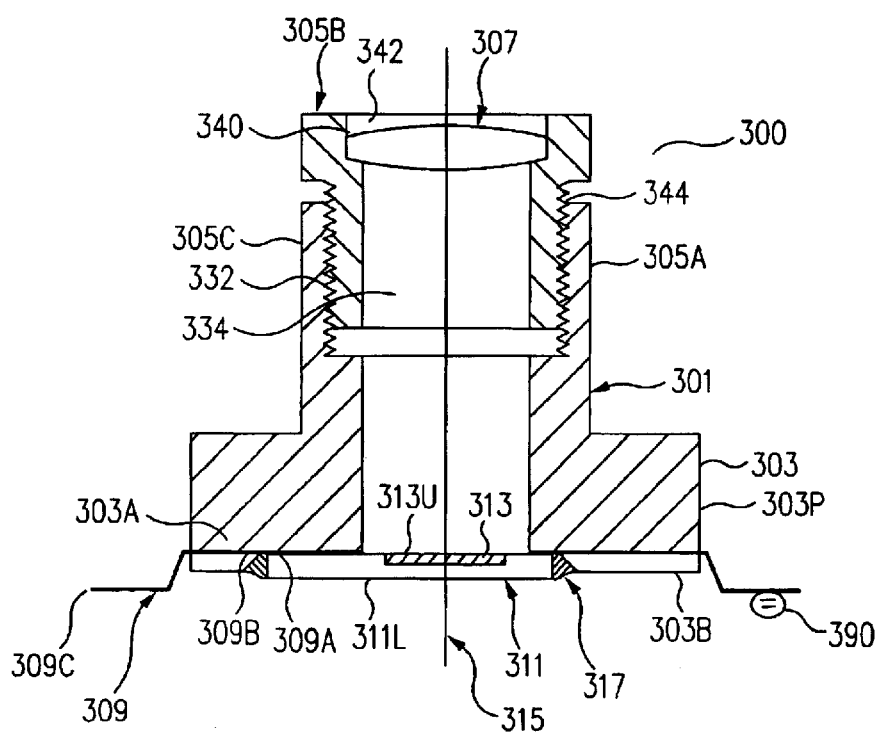
FIG. 3 is a cross-sectional view of an adjustable focus image sensor assembly in accordance with one embodiment of the invention.

FIG. 3 is a cross-sectional view of an adjustable focus image sensor assembly 300 in accordance with another embodiment of the invention. Like image sensor 100 discussed above, adjustable focus image sensor assembly 300 is used in a wide variety of applications, e.g., cameras and cellular telephones.

Referring to FIG. 3, adjustable focus image sensor assembly 300 includes: an image sensor die package 301 with a base 303, a lens support housing 305A and a lens support 305B; an optical element 307; a lead frame 309; and an image sensor die 311 having an active region 313 and an upper surface 313U. Also shown in FIG. 3 is the optical centerline 315 and sealer 317, which covers a portion 309A of internal connection lead 309B of lead frame 309.

In one embodiment of the invention, image sensor die package 301 is molded plastic such as glass filled NORYL, e.g., glass filled nylon 6/6. In another embodiment of the invention, image sensor die package 301 is molded from a liquid crystal polymer such as Riton™ produced by Dow Chemical. In other embodiments of the invention, other materials are used. For example in one embodiment, image sensor die package 301 is a high temperature plastic such that image sensor die package 301 maintains integrity during re-flow, e.g., during melting of solder bumps, such as solder bump 123 in FIG. 2E, on image sensor die 311 (FIG. 3).

Image sensor die package 301 includes integrally formed base 303 and lens support housing. 305A. Lens support housing 305A includes an exterior cylindrical surface 305C and an interior cylindrical surface 305D, which defines a central aperture 334 having optical center line 315 perpendicular to upper surface 311U of image sensor die 311. Central aperture 334 extends upwards and is aligned above active area 313 such that active area 313 is visible through central aperture 334. As discussed in more detail below, to facilitate attachment of lens support 305B, interior cylindrical surface 332 of lens support housing 305A is threaded. Stated another way, central aperture 334 is a female threaded aperture.

It is worth noting that in some embodiments of the invention, optical centerline 315 does not align with a physical centerline (not shown) of image sensor die 311. That is to say, image sensor die 311 does not need to be centered on central aperture 334 and image sensor die 311 can be offset from the centerline (not shown) of adjustable focus image sensor assembly 300. The choice of whether to center image sensor die 311 along centerline 315 and central aperture 334 is made on an application-by-application basis and is based on the needs of the manufacturer. All that is necessary is that a desired portion of active region 313 be within central aperture 334.

In the embodiment of the invention shown in FIG. 3, image sensor die package 301 also includes lens support 305B. An optical element 307, such as a lens (hereinafter lens 307) is mounted in lens support 305B. In this embodiment, lens support 305B is a cylindrical annulus having an interior cylindrical surface 340, which defines an aperture 342. Lens 307 is positioned in aperture 342 such that lens 307 and lens support 305B also have a longitudinal axis coextensive with optical centerline 315. In one embodiment, interior cylindrical surface 340 may not be exactly cylindrical, e.g., is hourglass shaped, but has other shapes in other embodiments.

In one embodiment of the invention, lens support 305B has an exterior cylindrical surface 344, which is threaded. Stated another way, lens support 305B is male threaded. Of importance, the threading of exterior cylindrical surface 344 of lens support 305B corresponds with the threading of interior cylindrical surface 332 of lens support housing 305A thus allowing threaded attachment of lens support 305B to lens support housing 305A.

Lens support 305B is threaded into central aperture 334 of lens support housing 305A so that exterior cylindrical surface 344 is threadedly attached to interior cylindrical surface 332 of lens support housing 305A. This structure allows lens 307 to be readily adjusted relative to upper surface 311U and active region 313 of image sensor die 311 by rotating lens support 305B. More particularly, lens support 305B is rotated around optical centerline 315 in a first direction, e.g., clockwise looking downward at lens support 305B, to move lens support 305B and lens 307 towards upper surface 311U and active region 313 of image sensor die 311. Conversely, lens support 305B is rotated around centerline 315 in a second direction opposite the first direction, e.g., counter-clockwise looking downward at lens support 305B, to move lens support 305B and lens 307 away from upper surface 311U and active region 313 of image sensor die 311.

As discussed above, during use, radiation is directed at adjustable focus image sensor assembly 300. This radiation passes through lens 307 and strikes active area 313 of image sensor die 311, which responds to the radiation as is well known to those of skill in the art. In this embodiment, lens support 305B is rotated as described above until radiation passing through lens 307 is properly focused on active area 313 on upper surface 311U of image sensor die 311 once proper focus is attained, lens support 305B is typically prevented from unintentional rotation. For example, adhesive (not shown) is applied to secure lens support 305B to lens support housing 305A.

As seen in FIG. 3, adjustable focus image sensor assembly 300, like image sensor assembly 100 discussed above, also includes lead frame 309. Lead frame 309 includes internal connection leads 309B and external connection leads 309C. According to the present invention, lead frame 309 is integrally formed into image sensor die package 301 so that internal connection leads 309B of lead frame 309 are fully supported and structurally fortified by portion 303A of base 303 of image sensor die package 301.

In one embodiment of the invention, lead frame 309 is integrally formed into image sensor die package 301 by placing lead frame 309 in a mold (not shown) for forming image sensor die package 301 and then molding image sensor die package 301 around lead frame 309 so that all but portion 309A of internal connection leads 309B are surrounded, and supported, by image sensor die package 301. In one embodiment of the invention, image sensor die package 301 is molded, including lead frame 309, using injection molding by methods well known to those of skill in the art.

In another embodiment of the invention, lead frame 309 is attached to image sensor die package 301 with adhesive so that all but portion 309A of internal connection leads 309B are supported by image sensor die package 301. In yet another embodiment (not shown) of the invention, image sensor die package.301 is a two-piece package and lead frame 309 is sandwiched between the two pieces so that all but portion 309A of internal connection leads 309B are supported by image sensor die package 301. In another embodiment of the invention, lead frame 309 is ultrasonically welded to image sensor die package 301. In another embodiment of the invention, lead frame 309 is heat staked to sensor die package 301. In yet another embodiment of the invention lead frame 309 is snapped into position and friction mounted to sensor die package 301.

Also shown in FIG. 3 is an exemplary solder ball 390 that, in one embodiment of the invention, is formed on each of external connection leads 309C for making external connections. Solder balls, such as solder ball 390, and their use for making external connections to a larger unit such as a motherboard (not shown), are well know to those of skill in the art. Consequently, the methods of forming solder balls and their use for making external connections is not discussed in more detail herein to avoid detracting from the invention.

As seen in FIG. 3, according to the invention, external connection leads 309C of lead frame 309 extend beyond the perimeter 303P of base 303 of image sensor die package 301. Consequently, adjustable focus image sensor assembly 300 can be electrically connected to a larger component such as a circuit board or motherboard by methods well know to those of skill in the art.

As discussed above, and shown in FIG. 3, according to the invention, lead frame 309 is integrally formed into image sensor die package 301 so that lead frame 309, including internal connection leads 309B, is fully supported and structurally fortified by portion 303A of base 303 of image sensor die package 301. Consequently, the problems of bending, deformation and/or breaking of lead frame 309, internal connection leads 309B and/or external connection leads 309C, during image sensor die 311 attachment, and during the attachment of image sensor assembly 300 to an external unit such as a motherboard, are avoided.

Lead frame 309, including internal connection leads 309B, is fully supported and structurally fortified by portion 303A of base 303 of image sensor die 301. As a result, using the invention, image sensor die 311 can be connected to lead frame 309 using a standard flip-chip connection. Flip-chip connections, and methods for forming flip-chip connections, are well known to those of skill in the art. Consequently, the methods for making flip-chip connections are not discussed in more detail herein to avoid detracting from the invention.

In one embodiment of the invention, sealer 317 that covers portion 309A of internal connection lead 309B of lead frame 309 is an epoxy sealer such as those well known to those of skill in the art.

As discussed above, by molding lead frame 309, including internal connection leads 309B, into image sensor die package 301, lead frame 309, including internal connection leads 309B, is fully supported and structurally fortified by portion 303A of base 303 of image sensor die package 301. As a result, adjustable focus image sensor assemblies 300 of the invention can utilize flip-chip connections and avoid the costly and bulky bond wire connections of the prior art. In addition, image sensor assembly 300 can be mounted to an external unit, such as a motherboard, without fear of bending or breaking external connection leads 309C. Consequently, adjustable focus image sensor assemblies 300 of the invention are less expensive, more reliable, smaller and sturdier than prior art image sensor assemblies.

Figure 4A:
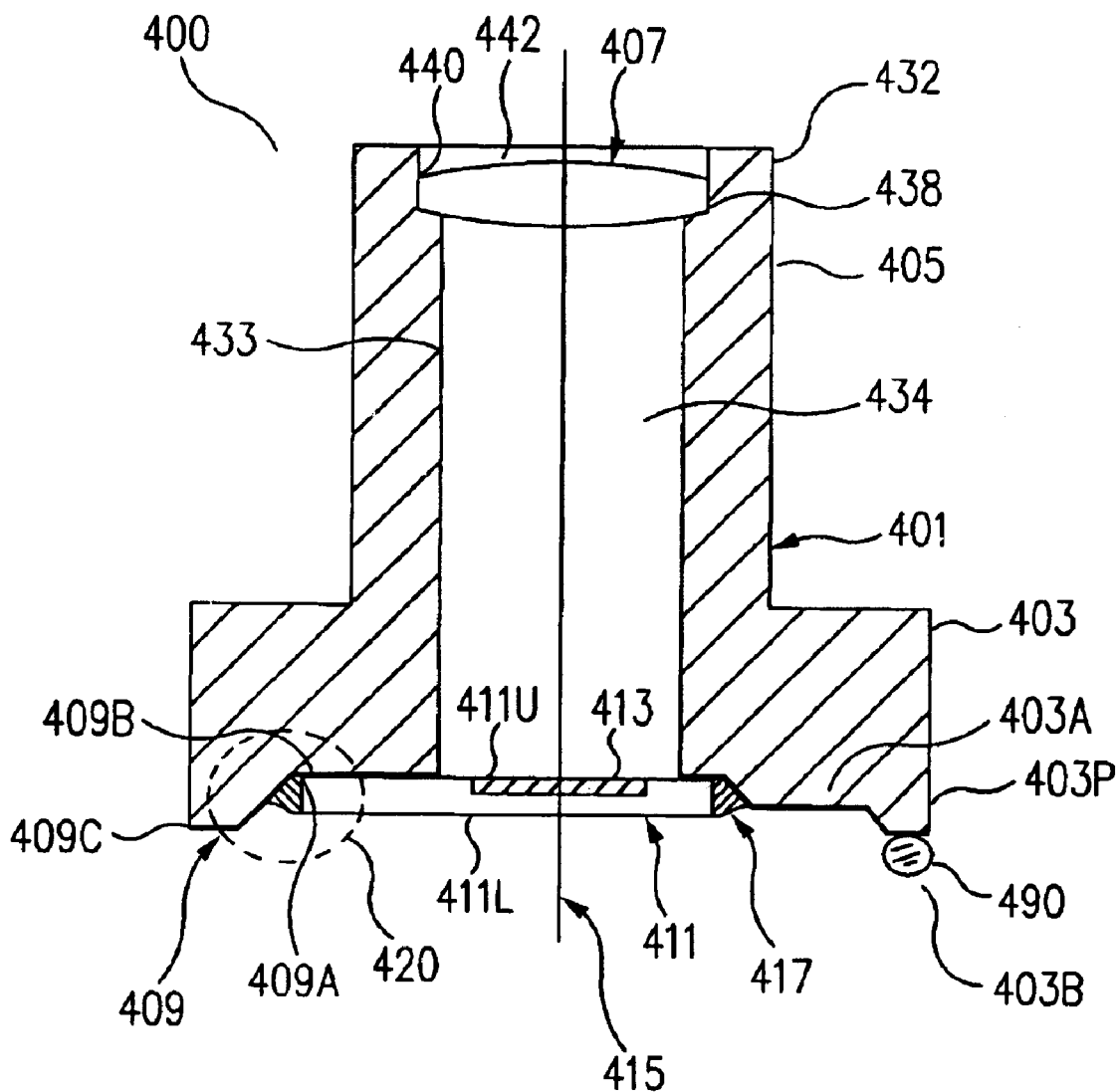
FIG. 4A is a cross-sectional view of an image sensor assembly including a Land Grid Array in accordance with one embodiment of the invention.

FIG. 4A is a cross-sectional view of image sensor assembly 400. Image sensor assembly 400 is used in a wide variety of applications, e.g., cameras and cellular telephones.

Referring to FIG. 4A, image sensor assembly 400 includes: an image sensor die package 401 with a base 403 and a lens housing 405; an optical element 407; a Land Grid Array 409 (hereinafter referred to as LGA 109); and an image sensor die 411 having an active region 413 on an upper surface 411U. Also shown in FIG. 4A is the optical centerline 415 and sealer 417 covering a portion 409A of internal connection point 409B of LGA 409.

Generally, active area 413 of image sensor die 411 is responsive to radiation, e.g., electromagnetic radiation, as is well known to those of skill in the art. For example, active area 413 is responsive to infrared radiation, ultraviolet light, and/or visible light. Illustratively, image sensor die 411 is a CMOS image sensor device, a charge coupled device (CCD), a pyroelectric ceramic on CMOS device, or an erasable programmable read-only memory device (EPROM), although other image sensors are used in other embodiments.

In one embodiment of the invention, image sensor die package 401 is molded plastic such as glass filled NORYL, e.g., glass filled nylon 6/6. In another embodiment of the invention, image sensor die package 401 is molded from a liquid crystal polymer such as Riton™ produced by Dow Chemical. In other embodiments of the invention, other materials are used. For example, in one embodiment, image sensor die package 401 is a high temperature plastic such that image sensor die package 401 maintains integrity during re-flow, e.g., during melting of solder bumps (not shown) on image sensor die 411.

Image sensor die package 401 includes integrally formed base 403 and lens housing 405. Lens housing 405 includes an exterior cylindrical surface 432 and an interior cylindrical surface 433, which defines a central aperture 434 having optical center line 415 perpendicular to upper surface 411U of image sensor die 411. Central aperture 434 extends upwards and is aligned above active area 413 such that active area 413 is visible through central aperture 434.

It is worth noting that in some embodiments of the invention, optical centerline 415 does not align with a physical centerline (not shown) of image sensor die 411. That is to say, image sensor die 411 does not need to be centered on central aperture 434 and image sensor die 411 can be offset from the centerline (not shown) of image sensor assembly 400. The choice of whether to center image sensor die 411 along centerline 415 and central aperture 434 is made on an application-by-application basis and is based on the needs of the manufacturer. All that is necessary is that a desired portion of active region 413 be within central aperture 434.

Optical element 407, such as a lens (hereinafter lens 407) is mounted in a support 438, hereinafter referred to as lens support 438. In this embodiment, lens support 438 is a cylindrical annulus having an interior cylindrical surface 440, which defines an aperture 442. Lens 407 is positioned in aperture 442 such that lens 407 and lens support 438 also have a longitudinal axis coextensive with optical centerline 415. In one embodiment, interior cylindrical surface 440 may not be exactly cylindrical, e.g., is hourglass shaped, but has other shapes in other embodiments.

As seen in FIG. 4A, image sensor assembly 400 also includes LGA 409. LGA 409 includes internal connection points 409B and external connection points 409C. According to the present invention, LGA 409 is integrally formed onto image sensor die package 401 so that internal connection points 409B and external connection points 409C of LGA 409 are fully supported and structurally fortified by portion. 403A of base 403 of image sensor die package 401.

In one embodiment of the invention, LGA 409 is integrally formed into image sensor die package 401 by placing LGA 409 in a mold (not shown) for forming image sensor die package 401 and then molding image sensor die package 401 on LGA 409 so that all but portion 409A of internal connection points 409B and external connection points 409C are supported, by image sensor die package 401. In one embodiment of the invention, image sensor die package 401 is molded, including LGA 409, using injection molding by methods well known to those of skill in the art.

In another embodiment of the invention, LGA 409 is attached to image sensor die package 401 with adhesive so that all but portion 409A of internal connection points 409B and external connection points 409C are supported by image sensor die package 401. In yet another embodiment of the invention, LGA 409 is formed on image sensor die package 401 directly so that all but portion 409A of internal connection points 409B and external connection points 409C are supported by image sensor die package 401.

Also shown in FIG. 4A is an exemplary solder ball 490 that, in one embodiment of the invention, is formed on each of external connection points 409C for making external connections. Solder balls, such as solder ball 490, and their use for making external connections to a larger unit such as a motherboard (not shown), are well know to those of skill in the art. Consequently, the methods of forming solder balls and their use for making external connections is not discussed in more detail herein to avoid detracting from the invention.

Figure 4B:
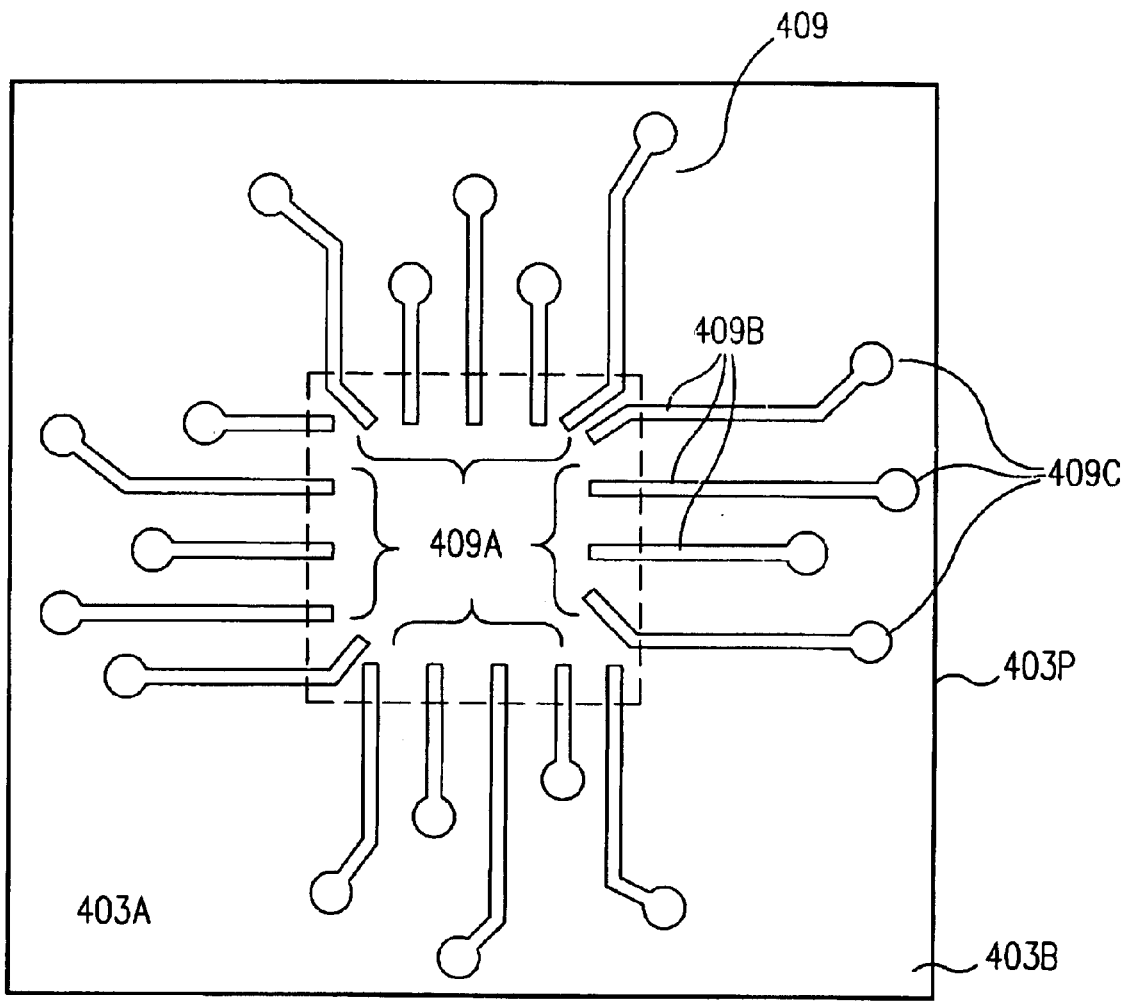
FIG. 4B is a bottom plan-view of the image sensor assembly of FIG. 4A, prior to the attachment of the image sensor die in accordance with one embodiment of the invention.

FIG. 4B is a bottom plan view of image sensor assembly 400 of FIG. 4A prior to the attachment of image sensor die 411. Shown in FIG. 4B is a bottom surface 403B of base 403 of image sensor die package 401 along with portion 409A of internal connection points 409B of LGA 409. As seen in FIG. 4B, according to the invention, external connection points 409C of LGA 409 are within, or at, the perimeter 403P of base 403 of image sensor die package 401. Consequently, image sensor assembly 400 can be electrically connected to a larger component such as a circuit board or motherboard with relative ease and without fear of bending or breaking external connection points 409C by surface mounting techniques well know to those of skill in the art.

As seen in FIG. 4B, LGA 409 is integrally formed onto image sensor die package 401 so that LGA 409, including internal connection points 409B, is fully supported and structurally fortified by portion 403A of base 403 of image sensor die package 401. Consequently, the problems of bending, deformation and/or breaking of LGA 409, internal connection points 409B and/or external connection points 409C, during image sensor die 411 attachment, and during the attachment of image sensor assembly 400 to an external unit such as a motherboard, are avoided.

Figure 4C:
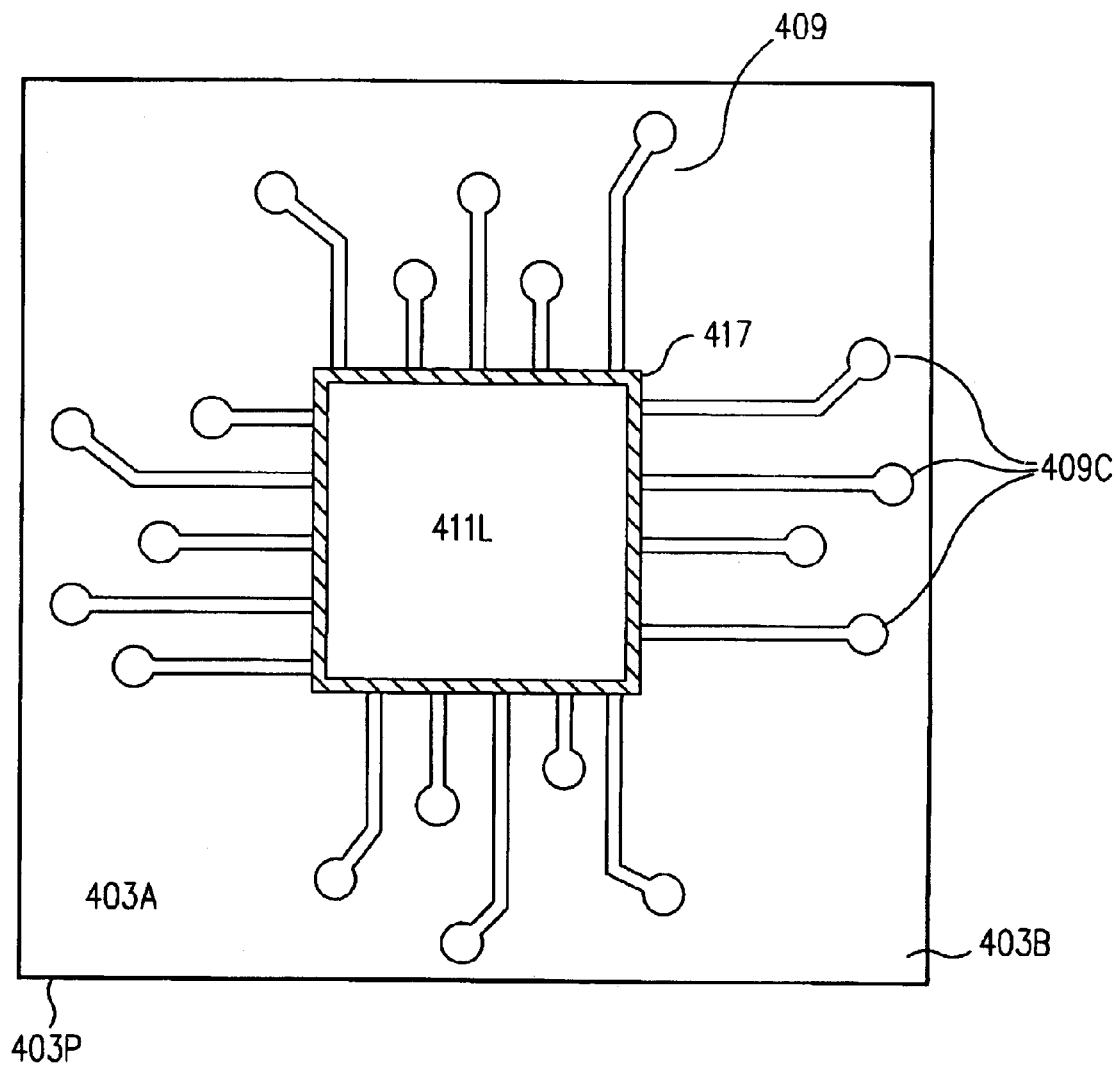
FIG. 4C is a bottom plan view of the image sensor assembly of FIG. 4A in accordance with one embodiment of the present invention.

FIG. 4C is a bottom plan view of image sensor assembly 400 of FIG. 4A, in accordance with one embodiment of the present invention, after image sensor die 411 has been attached. Shown in FIG. 4C is bottom surface 403B of base 403 of image sensor die package 401 along with lower surface 411L of image sensor die 411 and sealer 417 covering portion 409A (FIG. 4A) of internal connection points 409B of LGA 409. As seen in FIG. 4C, according to the invention, external connection points 409C of LGA 409 are within, or at, perimeter 403P of base 403 of image sensor die package 401. Consequently, image sensor assembly 400 can be electrically connected to a larger component such as a circuit board or motherboard with relative ease, by methods well known to those of skill in the art, without fear of bending or breaking external connection points 409C.

As discussed above and shown in FIGS. 4A, 4B and 4C, according to the invention, LGA 409 is integrally formed into image sensor die package 401 so that LGA 409, including internal connection points 409B, is fully supported and structurally fortified by portion 403A of base 403 of image sensor die package 401. Consequently, the problems of bending, deformation and/or breaking of LGA 409, internal connection points 409B and/or external connection points 409C, during image sensor die 411 attachment, and during the attachment of image sensor assembly 400 to an external unit such as a motherboard, are avoided. As a result, using the invention, image sensor die 411 can be connected to LGA 409 using a standard flip-chip connection. This aspect of the invention is shown in more detail in FIG. 4D.

Figure 4D:
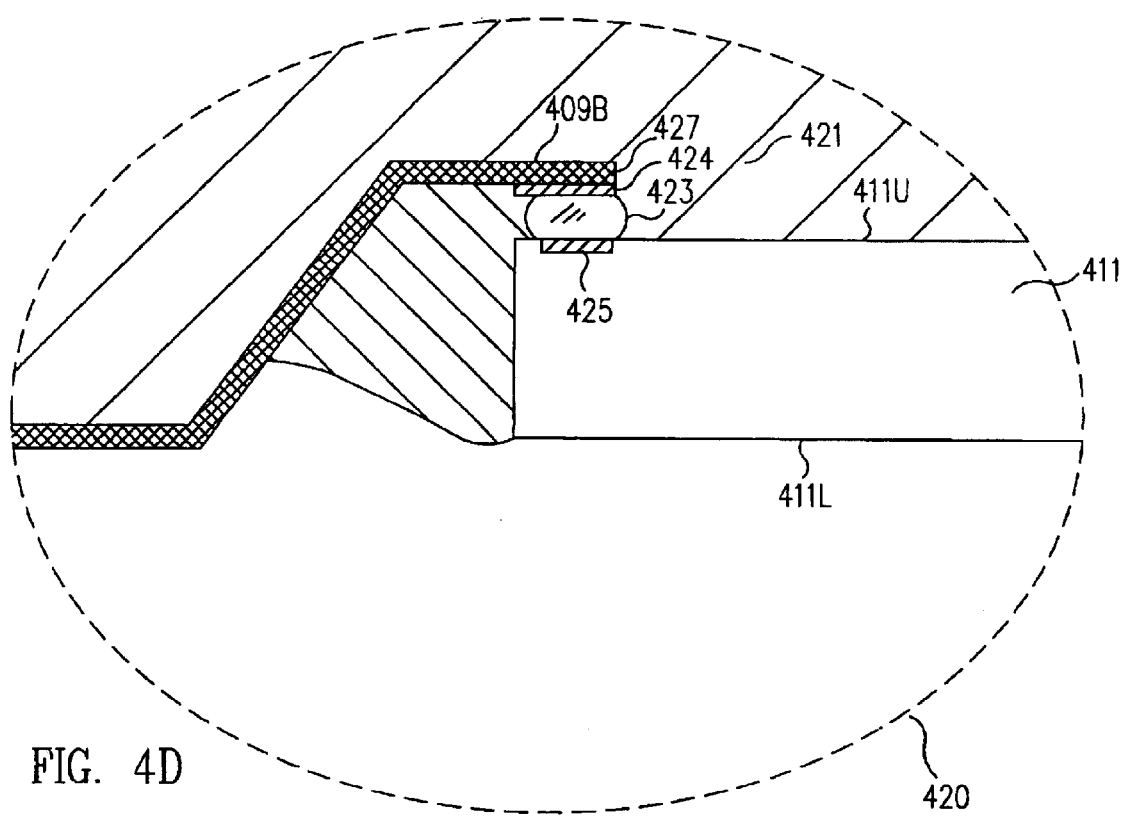
FIG. 4D is an enlargement of a portion of the flip-chip connection shown in FIG. 4A in accordance with one embodiment the invention.

FIG. 4D is an enlargement of the portion 420 shown in FIG. 4A. As seen in FIG. 4D, flip-chip connection 421 includes a solder bump 423 on upper surface 411U of image sensor die 411. Solder bump 423 can be made from several well known metals or compounds by methods well known to those of skill in the art. For instance, solder bump 423 can be: solder; lead; gold; silver; electrically conductive epoxy paste or film; or any other electrically conductive material. Solder bump 423 is re-flowed to form an electrical connection between contact 425 on image sensor die 411 and portion 427 of internal connection point 409B of LGA 409. As shown in FIG. 4D, in one embodiment of the invention, portion 427 of internal connection point 409B of LGA 409 includes a contact 424. Contact 424 can be either a plated contact or an applied contact and is typically formed of a wetting metal. Contact 424 can also include multiple layers of metals or other materials, as is well known in the art. Once the connection is made between contact 425 and portion 427 of internal connection point 409B, external connection point 409C (FIG. 4A) is electrically connected to contact 425 (FIG. 4D) and contact 425 can be readily connected to a larger structure (not shown), such as a circuit board or motherboard, by external contact point 409C and surface mounting methods well known to those of skill in the art.

This process is identically performed for each of a plurality of contacts. 425 on image sensor die 411 and a plurality of internal connection points 409B of LGA 409. Flip-chip connections, and methods for forming flip-chip connections, are well known to those of skill in the art. Consequently, the methods for making flip-chip connections are not discussed in more detail herein to avoid detracting from the invention.

In one embodiment of the invention, sealer 417 that covers portion 409A of internal connection points 409B of LGA 409 (FIGS. 4B, 4C and 4D) is an epoxy sealer, well known to those of skill in the art.

As discussed above, by molding LGA 409, including internal connection points 409B, onto image sensor die package 401, LGA 409, including internal connection points 409B, is fully supported and structurally fortified by portion 403A of base 403 of image sensor die package 401. As a result, image sensor assemblies 400 of the invention can utilize flip-chip connections and avoid the costly and bulky bond wire connections of the prior art. In addition, image sensor assembly 400 can be mounted to an external unit, such as a motherboard, without fear of bending or breaking external connection points 409C. Consequently, image sensor assemblies 400 of the invention are less expensive, more reliable, smaller and sturdier than prior art molded image sensor assemblies.

Figure 5:
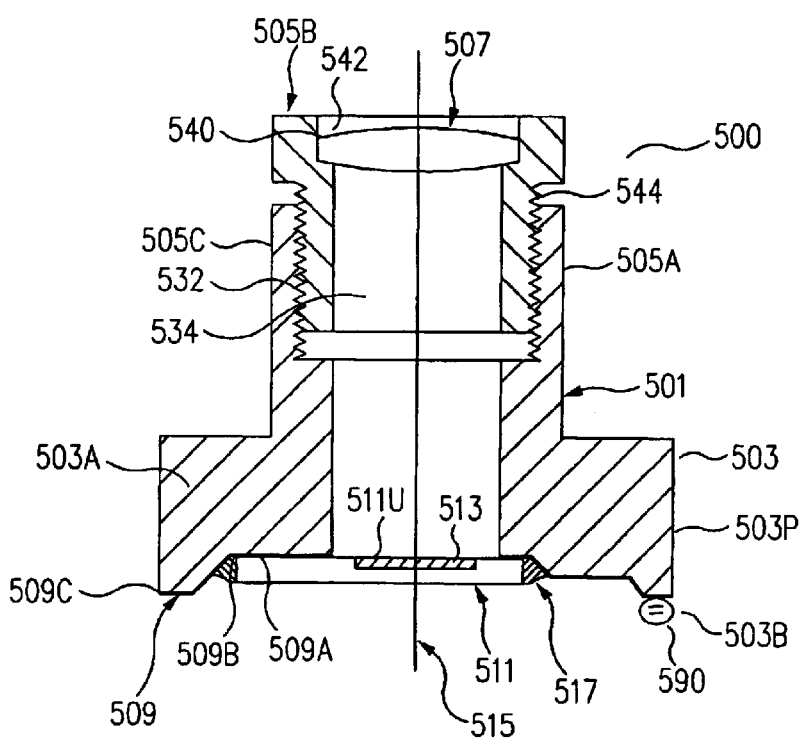
FIG. 5 is a cross-sectional view of an adjustable focus image sensor assembly with LGA in accordance with one embodiment of the invention.

FIG. 5 is a cross-sectional view of an adjustable focus image sensor assembly 500 in accordance with another embodiment of the invention. Like image sensor 400 discussed above, adjustable focus image sensor assembly 500 is used in a wide variety of applications, e.g., cameras and cellular telephones.

Referring to FIG. 5, adjustable focus image sensor assembly 500 includes: an image sensor die package 501 with a base 503, a lens support housing 505A and a lens support 505B; an optical element 507; a LGA 509; and an image sensor die 511 having an active region 513 and an upper surface 511U. Also shown in FIG. 5 is the optical centerline 515 and sealer 517, which covers a portion 509A of internal connection point 509B of LGA 509.

As with image sensor dice 111, 311 and 411 discussed above, in one embodiment of the invention, image sensor die package 501 is molded plastic such as glass filled NORYL, e.g., glass filled nylon 6/6. In another embodiment of the invention, image sensor die package 501 is molded from a liquid crystal polymer such as Riton TM produced by Dow Chemical. In other embodiments of the invention, other materials are used. For example, in one embodiment, image sensor die package 501 is a high temperature plastic such that image sensor die package 501 maintains integrity during re-flow, e.g., during melting of solder bumps, such as solder bump 423 in FIG. 4D, on image sensor die 511 (FIG. 5).

Image sensor die package 501 includes integrally formed base 503 and lens support housing 505A. Lens support housing 505A includes an exterior cylindrical surface 505C and an interior cylindrical surface 532, which defines a central aperture 534 having optical center line 515 perpendicular to upper surface 511U of image sensor die 511. Central aperture 534 extends upwards and is aligned above active area 513 such that active area 513 is visible through central aperture 534. As discussed in more detail below, to facilitate attachment of lens support 505B, interior cylindrical surface 532 of lens support housing 505A is threaded. Stated another way, central aperture 534 is a female threaded aperture.

It is worth noting that in some embodiments of the invention, optical centerline 515 does not align with a physical centerline (not shown) of image sensor die 511. That is to say, image sensor die 511 does not need to be centered on central aperture 534 and image sensor die 511 can be offset from the centerline (not shown) of adjustable focus image sensor assembly 500. The choice of whether to center image sensor die 511 along centerline 515 and central aperture 534 is made on an application-by-application basis and is based on the needs of the manufacturer. All that is necessary is that a desired portion of active region 513 be within central aperture 534.

In the embodiment of the invention shown in FIG. 5, image sensor die package 501 also includes lens support 505B. An optical element 507, such as a lens (hereinafter lens 507) is mounted in lens support 505B. In this embodiment, lens support 505B is a cylindrical annulus having an interior cylindrical surface 540, which defines an aperture 542. Lens 507 is positioned in aperture 542 such that lens 507 and lens support 505B also have a longitudinal axis coextensive with optical centerline 515. In one embodiment, interior cylindrical surface 540 may not be exactly cylindrical, e.g., is hourglass shaped, but has other shapes in other embodiments.

In one embodiment of the invention, lens support 505B has an exterior cylindrical surface 544, which is threaded. Stated another way, lens support 505B is male threaded. Of importance, the threading of exterior cylindrical surface 544 of lens support 505B corresponds with the threading of interior cylindrical surface 532 of lens support housing 505A thus allowing threaded attachment of lens support 505B to lens support housing 505A.

Lens support 505B is threaded into central aperture 534 of lens support housing 505A so that exterior cylindrical surface 544 is threadedly attached to interior cylindrical surface 532 of lens support housing 505A. This structure allows lens 507 to be readily adjusted relative to upper surface 511U and active region 513 of image sensor die 511 by rotating lens support 505B. More particularly, lens support 505B is rotated around optical centerline 515 in a first direction, e.g., clockwise looking downward at lens support 505B, to move lens support 505B and lens 507 towards upper surface 511U and active region 513 of image sensor die 511. Conversely, lens support 505B is rotated around centerline 515 in a second direction opposite the first direction, e.g., counterclockwise looking downward at lens support 505B, to move lens support 505B and lens 507 away from upper surface 511U and active region 513 of image sensor die 511.

As discussed above, during use, radiation is directed at adjustable focus image sensor assembly 500. This radiation passes through lens 507 and strikes active area 513 of image sensor die 511, which responds to the radiation as is well known to those of skill in the art. In this embodiment, lens support 505B is rotated as described above until radiation passing through lens 507 is properly focused on active area 513 on upper surface 511U of image sensor die 511. Once proper focus is attained, lens support 505B is typically prevented from unintentional rotation. For example, adhesive (not shown) is applied to secure lens support 505B to lens support housing 505A.

As seen in FIG. 5, adjustable focus image sensor assembly 500, like image sensor assembly 400 discussed above, also includes LGA 509. LGA 509 includes internal connection points 509B and external connection points 509C. According to the present invention, LGA 509 is integrally formed into image sensor die package 501 so that internal connection points 509B and external connection points 509C of LGA 509 are fully supported and structurally fortified by portion 503A of base 503 of image sensor die package 501, In one embodiment of the invention, LGA 509 is integrally formed onto image sensor die package 501 by placing LGA 509 in a mold (not shown) for forming image sensor die package 501 and then molding image sensor die package 501 around LGA 509 so that all but portion 509A of internal connection points 509B and external connection points 509C are supported, by image sensor die package 501. In one embodiment of the invention, image sensor die package 501 is molded, including LGA 509, using injection molding by methods well known to those of skill in the art.

In another embodiment of the invention, LGA 509 is attached to image sensor die package 501 with adhesive so that all but portion 509A of internal connection points 509B and external connection points 509C are supported by image sensor die package 501. In yet another embodiment of the invention, LGA 509 is formed directly on image sensor die package 501 so that all but portion 509A of internal connection points 509B and external connection points 509C are supported by image sensor die package 501.

Also shown in FIG. 5 is an exemplary solder ball 590 that, in one embodiment of the invention, is formed on each of external connection points 509C for making external connections. Solder balls, such as solder ball 590, and their use for making external connections to a larger unit such as a motherboard (not shown) are well know to those of skill in the art. Consequently, the methods of forming solder balls and their use for making external connections is not discussed in more detail herein to avoid detracting from the invention.

As seen in FIG. 5, according to the invention, external connection points 509C of LGA 509 are within, or at, the perimeter 503P of base 503 of image sensor die package 501. Consequently, adjustable focus image sensor assembly 500 can be electrically connected to a larger component such as a circuit board or motherboard without fear of bending or breaking external connection points 509C.

As discussed above, and as shown in FIG. 5, according to the invention, LGA 509 is integrally formed into image sensor die package 501 so that LGA 509, including internal connection points 509B and external connection points 509C, is fully supported and structurally fortified by portion 503A of base 503 of image sensor die package 501. Consequently, the problems of bending, deformation and/or breaking of LGA 509, internal connection points 509B and/or external connection points 509C, during image sensor die 511 attachment, and during the attachment of image sensor assembly 500 to an external unit such as a motherboard, are avoided.

LGA 509, including internal connection points 509B and external connection points 509C, is fully supported and structurally fortified by portion 503A of base 503 of image sensor die 501. As a result, using the invention, image sensor die 511 can be connected to LGA 509 using a standard flip-chip connection. Flip-chip connections, and methods for forming flip-chip connections, are well known to those of skill in the art. Consequently, the methods for making flip-chip connections are not discussed in more detail herein to avoid detracting from the invention.

In one embodiment of the invention, sealer 517 that covers portion 509A of internal connection points 509B of LGA 509 is an epoxy sealer such as those well known to those of skill in the art.

As discussed above, by molding LGA 509, including internal connection points 509B and external connection points 509C, into image sensor die package 501, LGA 509, including internal connection points 509B and external connection points 509C, is fully supported and structurally fortified by portion 503A of base 503 of image sensor die package 501. As a result, adjustable focus image sensor assemblies 500 of the invention can utilize flip-chip connections and avoid the costly and bulky bond wire connections of the prior art. In addition, image sensor assembly 500 can be mounted to an external unit, such as a motherboard, with fear of bending or breaking external connection points 509C. Consequently, adjustable focus image sensor assemblies 500 of the invention are less expensive, more reliable, smaller and sturdier than prior art image sensor assemblies.

In some embodiments of the invention it is desirable to further protect active areas 113, 313, 413 and 513 of image sensor dice 111, 311, 411 and 511, respectively, to avoid particulate contamination of active area 113, 313, 413 and 513 (see FIGS. 2B, 3, 4A and 5). In these instances, a supplementary optical element or window can be added to the structures discussed above. For example, a window can be attached directly over active areas 113, 313, 413 and 513, and to upper surfaces 111U, 311U, 411U and 511U of image sensor dice 111, 311, 411, and 511 using a method similar to that described in Webster et al., U.S. patent application Ser. No. 09/490,717, filed Jan. 25, 2000; Glenn et al., U.S. patent application Ser. No. 09/577,692, filed May 22, 2000; and Glenn et al., U.S. patent application Ser. No. 09/610,314, filed Jul. 5, 2000, which are all herein incorporated by reference in their entireties.

Figure 6:
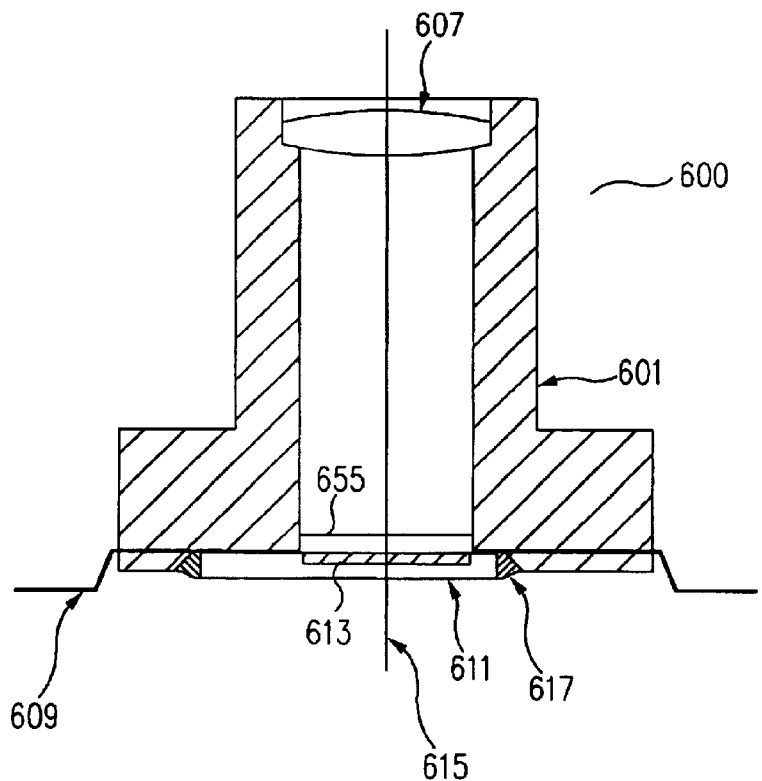
FIG. 6 shows an image sensor assembly that is similar to the image sensor assembly of FIGS. 2A, 2B, 2C, 2D and 2E but includes a supplemental optical element in accordance with one embodiment of the invention.

FIG. 6 shows an image sensor assembly 600 that is similar to image sensor assembly 100 of FIGS. 2A, 2B, 2C, 2D and 2E but includes a supplemental optical element 655. As shown in FIG. 6, image sensor assembly 600 includes: lens 607; image sensor die package 601; integrally formed lead frame 609; optical centerline 615; image sensor die 611 with active region 613;. sealant 617; and supplemental optical element 655, referred to hereinafter as window 655, that is positioned over active region 613 of image sensor die 611 to protect active region 613 from particulate and other contamination.

While FIG. 6 shows an image sensor assembly 600 similar to image sensor assembly 100 of FIG. 2B, those of skill in the art will readily recognize that window 655 could be added to any of the image sensor assemblies 100,. 300, 400 or 500 discussed above. Image sensor assembly 600 was chosen as being similar to image sensor assembly 100 for simplicity and to avoid detracting form the invention by disclosing a multitude of embodiments at one time.

Figure 7:
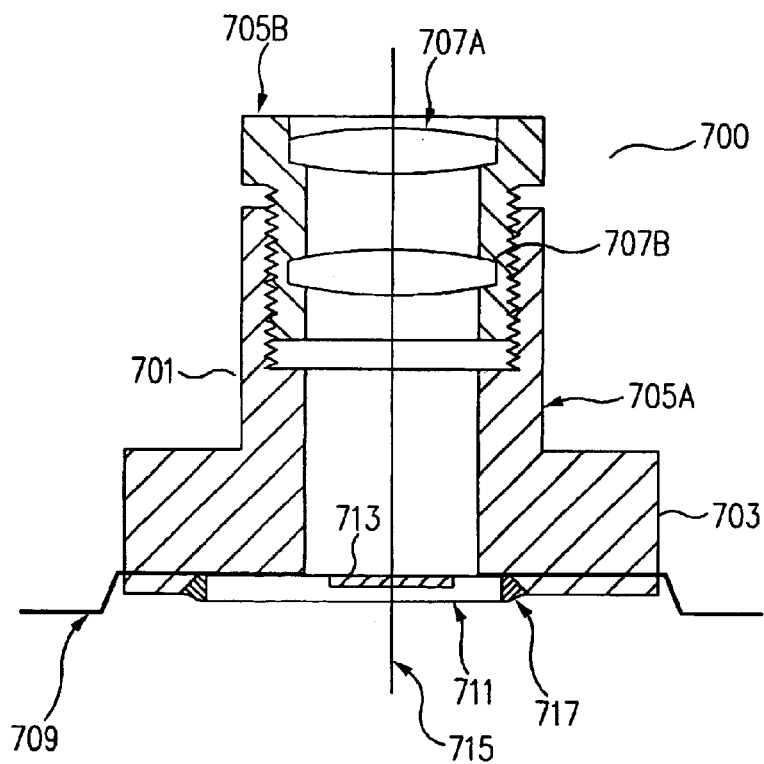
FIG. 7 shows an image sensor assembly that is similar to the image sensor assembly of FIG. 3 but includes a second optical element in accordance with one embodiment of the invention.

In some instances, it is desirable to include multiple optical elements, such as lenses, in a single image sensor assembly. FIG. 7 shows an image sensor assembly 700 that is similar to image sensor assembly 300 of FIG. 3 but includes a second optical element 707B, hereinafter referred to as second lens 707B. As shown in FIG. 7, image sensor assembly 700 includes: first lens 707A; image sensor die package 701 with a base 703, a lens support housing 705A and a lens support 705B; integrally formed lead frame 709; optical centerline 715; image sensor die 711 with active region 713; sealant 717; and second lens 707B, that is positioned over active region 713 of image sensor die 711 and below first lens 707A.

While FIG. 7 shows an image sensor assembly 700 similar to image sensor assembly 300 of FIG. 3, those of skill in the art will readily recognize a second optical element, such as second lens 707B, could be added to any of the image sensor assemblies 100, 300, 400, 500 or 600 discussed above. Image sensor assembly 700 was chosen as being similar to image sensor assembly 300 for simplicity and to avoid detracting form the invention by disclosing a multitude of embodiments at one time.

As discussed above, according to the present invention, an image sensor assembly includes a lead frame or Land Grid Array (LGA) integrally formed into a molded image sensor die package so that the lead frame or LGA is fully supported and structurally fortified by the molded image sensor die package. An image sensor die is then attached to the thus supported lead frame or LGA using a standard flip-chip connection.

The image sensor assemblies of invention include a molded image sensor package. Consequently, the image sensor assemblies of the invention do not suffer from the high costs associated with ceramic assemblies nor are they labor intensive or require large tolerances. In addition, the image sensor assemblies of the invention do not involve mounting the housing at the printed circuit board level. Consequently, the image sensor assemblies of the invention are a significant improvement over the prior art ceramic image sensor assemblies.

In addition, according to the invention, the lead frame or LGA is integrally formed into a molded image sensor die package so that the lead frame or LGA is fully supported and structurally fortified by the molded image sensor die package. Consequently, the problems of bending, deformation and/or breaking of the lead frame or LGA during image sensor die attachment, and during the attachment of image sensor assembly to an external unit such as a motherboard, are avoided. As a result, proper connections are made, leads do not break, the connections are not stressed and the resulting structures are not warped nor do they suffer from poor reliability.

Thus, using the invention, molded image sensor assemblies can utilize flip-chip connections and avoid the costly and bulky bond wire connections of the prior art that included the standard bond wire connection substrates discussed above. As a result, molded image sensor assemblies of the invention are less expensive, more reliable, smaller and sturdier than prior art molded image sensor assemblies.

This application is related to: Commonly assigned U.S. patent application Ser. No. 09/457,505, listing Steven Webster as inventor, filed on Dec. 8, 1999; Commonly assigned U.S. patent application Ser. No. 09/490,717, listing Steven Webster et al. as inventors, filed on Jan. 25, 2000; Commonly assigned U.S. patent application Ser. No. 09/577,692, listing Glenn et al. as inventors, filed May 22, 2000; Commonly assigned U.S. patent application Ser. No. 09/610,314, listing Glenn et al. as inventors, filed Jul. 5, 2000, now U.S. Pat. No. 6,407,381 issued Jun. 18, 2002; and Commonly assigned and co-filed U.S. patent application Ser. No. 09/896,447, entitled "IMAGE SENSOR PACKAGE WITH VISION DIE IN LENS HOUSING", all of which are herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible.

For example, the discussion above was directed, in large part, to embodiments of the invention that included image sensor dice with active regions that were receivers of radiation. However, those of skill in the art will readily recognize that, with little or no modification, the structure of the invention discussed above can easily be applied to structures including image sensor dice which have active regions that transmit radiation so that the invention can include image sensor dice which are a receiver of radiation, a transmitter of radiation, or a transceiver, i.e., a transmitter and a receiver, of radiation.

As another example, the discussion above was directed, in large part, to embodiments of the invention that included lead frames and Land Grid Arrays. However, those of skill in the art will recognize that with little or no modification the invention could be applied to other external connection embodiments such as leadless chip carriers, ball grid arrays or pin arrays.

As yet another example, the optical elements such as lenses 107, 307, 407, 507, 607, 707A and 707B are, in various other embodiments of the invention, diverging lenses, converging lenses, simple windows or zoom lenses made of glass, plastic or other optical materials.

Consequently, the structures discussed above were chosen by way of example only and the scope of the invention is at least as broad as given by the following claims.

What is claimed is:

1. A method for packaging an image sensor comprising:
   forming an image sensor die package, said image sensor die package comprising:
   an optical element support, said optical element support defining an aperture with an optical centerline;
   an optical element support housing comprising said optical element support;
   a base; and
   a land grid array comprising internal connection points and external connection points, wherein at least one surface of at least one of said external connection points is external to said image sensor die package for electrically coupling said image sensor die package to an external component that is external to said image sensor die package;
   forming at least a portion of said land grid on said base of said image sensor die package to become an integral part of said image sensor die package;
   positioning in said optical element support a first optical element comprising a first optical element first surface and a first optical element second surface, opposite said first optical element first surface, said first optical element being positioned in said optical element support such that said first optical element first surface and said first optical element second surface are approximately perpendicular to said optical centerline;
   positioning in said optical element support a second optical element comprising a second optical element first surface and a second optical element second surface, opposite said second optical element first surface, said second optical element being displaced a distance from said first optical element along said optical centerline in said optical element support such that said second optical element first surface and said second optical element second surface are approximately perpendicular to said optical centerline;
   providing an image sensor die comprising an image sensor die first surface and an image sensor die second surface, opposite said image sensor die first surface, said image sensor die first surface having an active region; and
   electrically coupling said image sensor die to said internal connection points of said land grid array in a flip-chip configuration such that said active region of said first surface of said image sensor die is at least partially aligned with said optical element support aperture and said optical centerline so that at least a portion of said active region faces said second surface of said second optical element.

2. A method for packaging an image sensor comprising:
   forming an image sensor die package, said image sensor die package comprising:
   an optical element support, said optical element support defining an optical element support aperture with an optical centerline and optical element support aperture diameter;
   an optical element support housing, said optical element support housing defining an optical element support housing aperture with the same said optical centerline and an optical element support housing aperture diameter;

a base, said optical element support housing being positioned on a second surface of said base, wherein;

said optical element support aperture diameter is smaller than said optical element support housing aperture diameter and said optical element support is positioned within said optical element support housing, further wherein;

said optical element support is movable with respect to said optical element support housing along said optical centerline, thereby allowing a focal point to be adjusted; and a land grid array comprising internal connection points and external connection points, wherein at least one surface of at least one of said external connection points is external to said image sensor die package for electrically coupling said image sensor die package to an external component that is external to said image sensor die package;

molding said image sensor die package over said land grid array such that said land grid array is formed on a first surface of said image sensor die package base to become an integral part of said image sensor die package;

positioning in said optical element support a first optical element comprising a first optical element first surface and a first optical element second surface, opposite said first optical element first surface, said first optical element being positioned in said optical element support such that said first optical element first surface and said first optical element second surface are approximately perpendicular to said optical centerline;

positioning in said optical element support a second optical element comprising a second optical element first surface and a second optical element second surface, opposite said second optical element first surface, said second optical element being displaced a distance from said first optical element along said optical centerline in said optical element support such that said second optical element first surface and said second optical element second surface are approximately perpendicular to said optical centerline;

providing an image sensor die comprising an image sensor die first surface and an image sensor die second surface, opposite said image sensor die first surface, said image sensor die first surface having an active region; and electrically coupling said image sensor die first surface to said internal connection points of said land grid array in a flip-chip configuration such that said active region of said first surface of said image sensor die is at least partially aligned with: said optical element support aperture; said optical element support housing aperture; and said optical centerline so that at least a portion of said active region faces said second surface of said optical element.

3. The method of claim 1, wherein said image sensor die package is formed of molded plastic package, said image sensor die package being molded over said land grid array such that said land grid array is formed on a first surface of said image sensor die package.

4. The method of claim 3, wherein;

said land grid array is formed on a first surface of said image sensor die package base.

5. The method of claim 2, wherein;

said optical element support and said optical element support housing are formed with threads such that said optical element support and said optical element support housing are threadably attached, thereby allowing said focal point of said optical element to be adjusted by rotating said optical element support around said optical centerline relative to said optical element support housing.

6. The method of claim 2, wherein;

said image sensor die package is formed of molded plastic, said image sensor die package being molded over said land grid array such that said land grid array is formed on a first surface of said image sensor die package.

7. The method of claim 6, wherein;

said land grid array is formed on a first surface of said image sensor die package base.

8. A packaged image sensor comprising:

an image sensor die package, said image sensor die package comprising:

an optical element support, said optical element support defining an aperture with an optical centerline;

an optical element support housing comprising said optical element support;

a base; and a land grid array comprising internal connection points and external connection points, wherein at least one surface of at least one of said external connection points is external to said image sensor die package for electrically coupling said image sensor die package to an external component that is external to said image sensor die package, at least a portion of said land grid on said base of said image sensor die package being an integral part of said image sensor die package;

a first optical element positioned in said optical element support, said first optical element comprising a first optical element first surface and a first optical element second surface, opposite said first optical element first surface, said first optical element being positioned in said optical element support such that said first optical element first surface and said first optical element second surface are approximately perpendicular to said optical centerline;

a second optical element positioned in said optical element support, said second optical element comprising a second optical element first surface and a second optical element second surface, opposite said second optical element first surface, said second optical element being displaced a distance from said first optical element along said optical centerline in said optical element support such that said second optical element first surface and said second optical element second surface are approximately perpendicular to said optical centerline; and an image sensor die comprising an image sensor die first surface and an image sensor die second surface, opposite said image sensor die first surface, said image sensor die first surface having an active region, said image sensor die being coupled to said internal connection points of said land grid array in a flip-chip configuration such that said active region of said first surface of said image sensor die is at least partially aligned with said optical element support aperture and said optical centerline so that at least a portion of said active region faces said second surface of said second optical element.

9. The method of claim 8, wherein said image sensor die package is formed of molded plastic package, said image sensor die package being molded over said land grid array such that said land grid array is formed on a first surface of said image sensor die package.

10. The method of claim 9, wherein;

said land grid array is formed on a first surface of said image sensor die package base.

11. A packaged image sensor comprising:

an image sensor die package, said image sensor die package comprising:

an optical element support, said optical element support defining an optical element support aperture with an optical centerline and optical element support aperture diameter;

an optical element support housing, said optical element support housing defining an optical element support housing aperture with the same said optical centerline and an optical element support housing aperture diameter;

a base, said optical element support housing being positioned on a second surface of said base, wherein;

said optical element support aperture diameter is smaller than said optical element support housing aperture diameter and said optical element support is positioned within said optical element support housing, further wherein;

said optical element support is movable with respect to said optical element support housing along said optical centerline, thereby allowing a focal point to be adjusted; and a land grid array comprising internal connection points and external connection points, wherein at least one surface of at least one of said external connection points is external to said image sensor die package for electrically coupling said image sensor die package to an external component that is external to said image sensor die package; wherein, said image sensor die package is molded over said land grid array such that said land grid array is formed on a first surface of said image sensor die package base to become an integral part of said image sensor die package;

a first optical element positioned in said optical element support, said first optical element comprising a first optical element first surface and a first optical element second surface, opposite said first optical element first surface, said first optical element being positioned in said optical element support such that said first optical element first surface and said first optical element second surface are approximately perpendicular to said optical centerline;

a second optical element positioned in said optical element support, said second optical element comprising a second optical element first surface and a second optical element second-surface, opposite said second optical element first surface, said second optical element being displaced a distance from said first optical element along said optical centerline in said optical element support such that said second optical element first surface and said second optical element second surface are approximately perpendicular to said optical centerline;

an image sensor die comprising an image sensor die first surface and an image sensor die second surface, opposite said image sensor die first surface, said image sensor die first surface having an active region, said image sensor die first surface being electrically coupled to said internal connection points of said land grid array in a flip-chip configuration such that said active region of said first surface of said image sensor die is at least partially aligned with: said optical element support aperture; said optical element support housing aperture; and said optical centerline so that at least a portion of said active region faces said second surface of said optical element.

12. The method of claim 11, wherein;

said optical element support and said optical element support housing are formed with threads such that said optical element support and said optical element support housing are threadably attached, thereby allowing said focal point of said optical element to be adjusted by rotating said optical element support around said optical centerline relative to said optical element support housing.

13. The method of claim 11, wherein;

said image sensor die package is formed of molded plastic, said image sensor die package being molded over said land grid array such that said land grid array is formed on said first surface of said image sensor die package.

14. The method of claim 13, wherein said land grid array is formed on a said first surface of said image sensor die package base.

* * * * *